United States Patent
Iizuka et al.

(10) Patent No.: US 7,587,727 B2
(45) Date of Patent: Sep. 8, 2009

(54) PICKUP DEVICE

(75) Inventors: Hajime Iizuka, Tatebayasi (JP); Yasuhito Kojima, Isesaki (JP); Koichi Takezawa, Osato-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 792 days.

(21) Appl. No.: 11/100,920

(22) Filed: Apr. 7, 2005

(65) Prior Publication Data
US 2005/0229196 A1 Oct. 13, 2005

(30) Foreign Application Priority Data
Apr. 9, 2004 (JP) ............... 2004-115380
Dec. 15, 2004 (JP) ............... 2004-362436

(51) Int. Cl.
*G11B 17/03* (2006.01)
(52) U.S. Cl. .................................... 720/652
(58) Field of Classification Search .......... 720/652, 720/601, 631; 360/97.01; 369/30.98, 75.1, 369/215
See application file for complete search history.

(56) References Cited

U.S. PATENT DOCUMENTS

| | | | | |
|---|---|---|---|---|
| 5,528,442 A * | 6/1996 | Hisatomi | ............... | 369/30.98 |
| 5,543,982 A * | 8/1996 | Takagi et al. | ............. | 360/97.01 |
| 6,151,284 A * | 11/2000 | Watanabe et al. | ........... | 720/601 |
| 6,567,363 B1 * | 5/2003 | Juman et al. | ................ | 720/631 |
| 6,931,650 B2 | 8/2005 | Matsumura et al. | | |
| 2001/0012255 A1 * | 8/2001 | Furukawa et al. | .......... | 369/75.1 |
| 2003/0123374 A1 * | 7/2003 | Matsumura et al. | ......... | 369/215 |

FOREIGN PATENT DOCUMENTS

| | | |
|---|---|---|
| CN | 1428772 | 7/2003 |
| JP | 7302955 | 11/1995 |
| JP | 8124201 | 5/1996 |
| JP | 3069840 | 4/2000 |
| JP | 2003036551 | 2/2003 |
| JP | 2004013935 | 1/2004 |

OTHER PUBLICATIONS

State Intellectual Property Office of P.R. China, "Notification of First Office Action," (Nov. 24, 2006).

* cited by examiner

*Primary Examiner*—Tianjie Chen
(74) *Attorney, Agent, or Firm*—Pillsbury Winthrop Shaw Pittman LLP

(57) ABSTRACT

A pickup device comprises a flexible circuit member including a main circuit portion on which electric or electronic components are mounted and a sub-circuit portion connected to the main circuit portion. The pickup device further comprises a housing on which the flexible circuit member is mounted. Each of the main circuit portion and the sub-circuit portion has a single-sided structure and includes a ground portion. The sub-circuit portion is folded with respect to the main circuit portion. The flexible circuit member is mounted on the housing while the main circuit portion and the sub-circuit portion are held in an overlapping arrangement. With this arrangement, S/N ratio of electric signals can be improved while achieving cost reduction.

7 Claims, 15 Drawing Sheets

PICKUP DEVICE

CROSS-REFERENCE TO RELATED APPLICATIONS

The entire disclosure of Japanese Application Nos. 2004-362436 and 2004-115380 including the specification, claims, drawings, and abstract is incorporated herein by reference.

BACKGROUND OF THE INVENTION

1. Field of the Invention

The present invention relates to a pickup device including a flexible circuit member in which an anti-noise measure is implemented and cost reduction is achieved.

2. Description of the Related Art

FIG. 14 is a diagram showing a conventional pickup device 501.

"LD" is an abbreviation of "laser diode", while "LDD" is an abbreviation of "LD driver". LDD 510 is a laser driver circuit for driving an LD 520 to emit laser light. Electric current is made to flow from the LDD 510 to the LD 520, and laser light is output from the LD 520. "LDD" may be referred to as a "laser driver". By means of laser light emitted from the LD 520 by supplying an electric current from the LDD 510 to the LD 520, information can be recorded on a disc 700, and information recorded on the disc 700 can be reproduced.

The laser light output from the LD 520 is irradiated on the disc 700 via a diffraction grating 530, intermediate lens 540, half mirror 550, and objective lens 560. A portion of laser light reflected off of the disc 700 is input into PDIC 570 or the like. "PDIC" is an abbreviation of "photo diode IC". Upon receipt of the light, the PDIC 570 converts the light signal into an electric signal, and outputs the electric signal for use in operating a servo mechanism (not shown) of a lens holder (not shown) of the pickup device 501.

Further, a portion of the laser light output from the LD 520 is introduced into the FMD 580. "FMD" is an abbreviation of "front monitor diode". The FMD 580 monitors the laser light output from the laser diode so as to provide feedback control of the laser diode.

The LDD 510, LD 520, diffraction grating 530, intermediate lens 540, half mirror 550, objective lens 560, PDIC 570, and FMD 580 are mounted on a housing (not shown). The LDD 510, LD 520, PDIC 570, and FMD 580 are electrically connected to an FPC 505. "FPC" is an abbreviation of "flexible printed circuit". The FPC 505 may be formed by printing in parallel a plurality of circuit conductors composed of a metal foil such as copper foil on an insulating sheet, and further providing a protective layer on top. The optical pickup device 501 is configured with the above-described various components. The optical pickup device 501 may further comprise other components which are not shown in FIG. 14 for simplification of the drawing.

The optical pickup device 501 is used to reproduce and record data (such as information) on a medium. Examples of the media include various optical discs such as read-only optical discs including CD-ROM and DVD-ROM, write-once optical discs including CD-R, DVD-R, and DVD+R, and writable/erasable or rewritable optical discs including CD-RW, DVD-RW, DVD+RW, and DVD-RAM.

"CD" is an abbreviation of "compact disc". "DVD" is an abbreviation of "digital versatile disc" or "digital video disc". "ROM" in "CD-ROM" and "DVD-ROM" is an abbreviation of "read only memory". As such, CD-ROM and DVD-ROM are for reading only. "R" in "CD-R", "DVD-R", and "DVD+R" is an abbreviation of "recordable". As such, CD-R, DVD-R, and DVD+R are recordable. "RW" in "CD-RW", "DVD-RW", and "DVD+RW" is an abbreviation of "rewritable". As such, CD-RW, DVD-RW, and DVD+RW are rewritable. "DVD-RAM" is an abbreviation of "digital versatile disc random access memory", and denotes an optical disc that is readable, writable, and erasable.

The optical pickup device 501 allows reproduction of data recorded on various optical discs and recording of data on various recordable and rewritable optical discs. In order to improve the S/N ratio in relation to noise generated from various components mounted in the optical pickup device 501, an FPC having two conductive layers may be employed. S/N denotes the ratio of signal to noise. The signal and noise are indicated in units of dB (decibels). Noise refers to disturbances in electric signals and undesired sounds.

As an example FPC having two conductive layers, FIG. 15 depicts a double-sided flexible printed circuit board in which warping of the board is prevented so as to facilitate handling of the board and to increase yield of the boards assembled with components.

FIG. 15 is a diagram for explaining one example of a conventional double-sided flexible printed circuit board.

The double-sided flexible printed circuit board (FPC) 801 is curved along a curve center line L. A curvature 820 is formed in a wiring portion 810 provided on one side. A conductive pattern 802 is formed on the front S-side surface (denoted in FIG. 15) of the base film 806 constituting the FPC 801. Further on top, a photosensitive cover layer 804 is overlapped so as to insulate the conductive pattern 802. The photosensitive cover layer 804 may be referred to as a "photo-imageable cover layer" and abbreviated as PIC. On the rear T-side surface (denoted in FIG. 15) of the base film 806 constituting the FPC 801, a pseudo conductive pattern 803 for reinforcement is provided in regions other than the portion near the curve center line L. A photosensitive cover layer 805 for insulating the pseudo conductive pattern 803 is provided covering the pseudo conductive pattern 803.

On the rear T-side surface of the wiring portion 810 provided on one side of the FPC 801, the reinforcing conductive pattern 803 and the PIC layer 805 are absent at a portion near the curve center line L, namely, between M-M. The conductive pattern 802 and the PIC layer 804 are provided around the curve center line L on the front S-side surface alone.

In recent years, there have been increasing requests for higher speeds in performing a recording operation with respect to the optical disc 700 (FIG. 14) such as a CD-R. However, if the recording operation speed with respect to the optical disc 700 such as a CD-R is increased in the pickup device 501 including the FPC 505 having a conventional design, there is a risk that noise would be generated due to various signals such as analog and digital signals which are input into and output from components such as the LDD 510, PDIC 570, and FMD 580. The noise may be generated in an area surrounding the portion at which the LDD 510 is mounted on the single-sided FPC 505, and from the LD 520 for a CD. The term "analog" denotes that a state of a substance or a system is represented by continuously variable physical quantities. "Digital" denotes that a state of a substance or a system is represented by signals composed of discrete numbers or letters.

When noise is generated, because of crosstalk among signals in the LD 520 for a CD, in areas surrounding the LDD 510, in the PDIC 570, and in the FMD 580, influence of the noise may reach into a low-power analog signal which is transmitted through the single-sided FPC 505. As a result, the pickup device 501 fails to perform normal operations.

"Crosstalk" denotes a level of interference generated at a transmitting end of a signal line.

In order to prevent noise caused by an analog or digital signal from influencing the low-power analog signal transmitted through the single-sided FPC 505, an FPC 801 comprising two conductive layers 802, 803 (FIG. 15) may be employed. The FPC 801 comprising two conductive layers includes a conductor member 802 on one side and a conductor member 803 on the other side, and is configured as one integral unit having the two layers on the respective sides.

The FPC 801 comprising the two conductive layers 802, 803 and having an anti-noise measure implemented therein is next described in detail. By reinforcing GND 803 of the FPC 801, which corresponds to one of the conductive layers of the FPC 801 comprising two conductive layers, undesired influence of a digital or analog signal on the low-power analog signal can be avoided. For example, by employing the FPC 801 comprising the two conductive layers 802, 803 shown in FIG. 15 in the pickup device 501 (FIG. 14) in place of the single-sided FPC 505 shown in FIG. 14, the S/N ratio of the pickup 501 can be improved. "GND" is an abbreviation of "ground" and denotes electrical grounding.

When the flexible circuit member 801 is configured in the form of the FPC including the two conductive layers 802, 803, the flexible circuit member 801 becomes expensive. The cost of the flexible circuit member 801 configured in the form of the FPC including the two conductive layers 802, 803 (FIG. 15) is approximately double the cost of the flexible circuit member 505 (FIG. 14) configured in the form of a single-sided FPC. By providing the flexible circuit member 801 including the two conductive layers 802, 803 integrated into one component in a pickup device 501 (FIG. 14), the product unit price of the pickup device 501 becomes increased. Accordingly, there exists a need for a pickup device which includes a flexible circuit member with an enhanced S/N ratio and for which cost increases are minimized.

SUMMARY OF THE INVENTION

According to the present invention, a pickup device comprises a flexible circuit member including a main circuit portion on which electric or electronic components are mounted and a sub-circuit portion connected to the main circuit portion. The pickup device further comprises a housing on which the flexible circuit member is mounted. The main circuit portion has a single-sided structure and includes a ground portion. The sub-circuit portion similarly has a single-sided structure and includes a ground portion. The sub-circuit portion is folded with respect to the main circuit portion. The flexible circuit member is mounted on the housing while the main circuit portion and the sub-circuit portion are held in an overlapping arrangement.

DESCRIPTION OF THE PREFERRED EMBODIMENT

Figure 1:
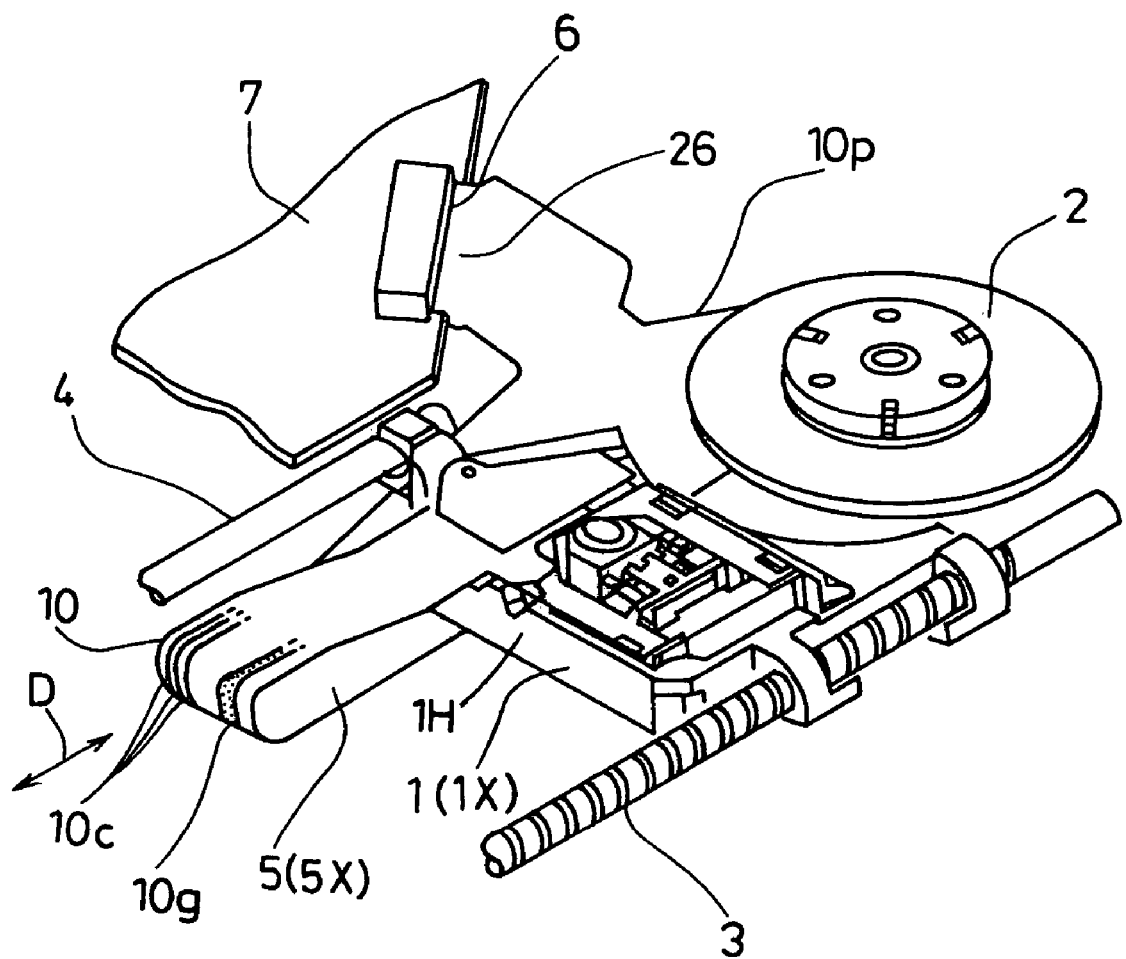
FIG. 1 is a perspective view showing a pickup device according to an embodiment of the present invention.

An embodiment of a pickup device according to the present invention is next described in detail referring to the drawings.

FIG. 1 is a perspective view showing a pickup device according to the present invention.

First Embodiment

Figure 9:
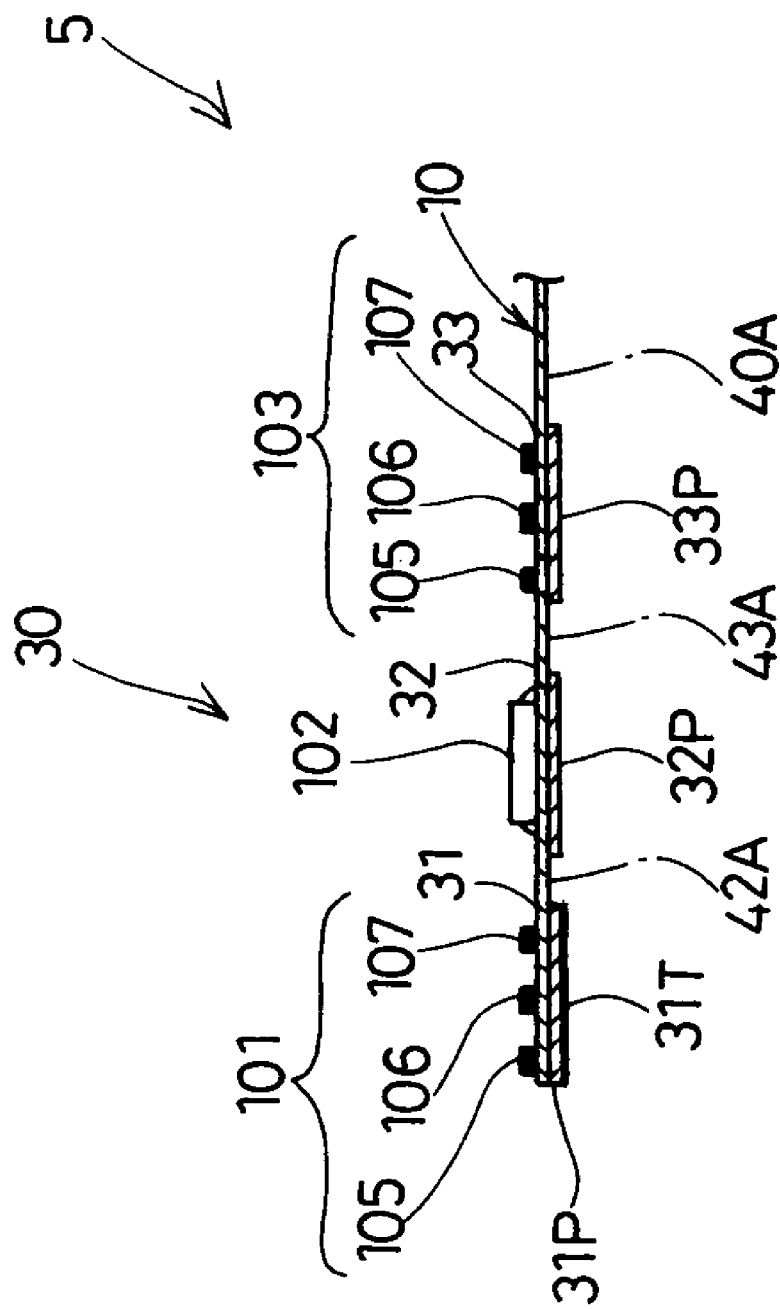
FIG. 9 is an explanatory diagram showing the component-mounting segments of the main circuit portion according to the embodiment of the present invention.
Figure 10:
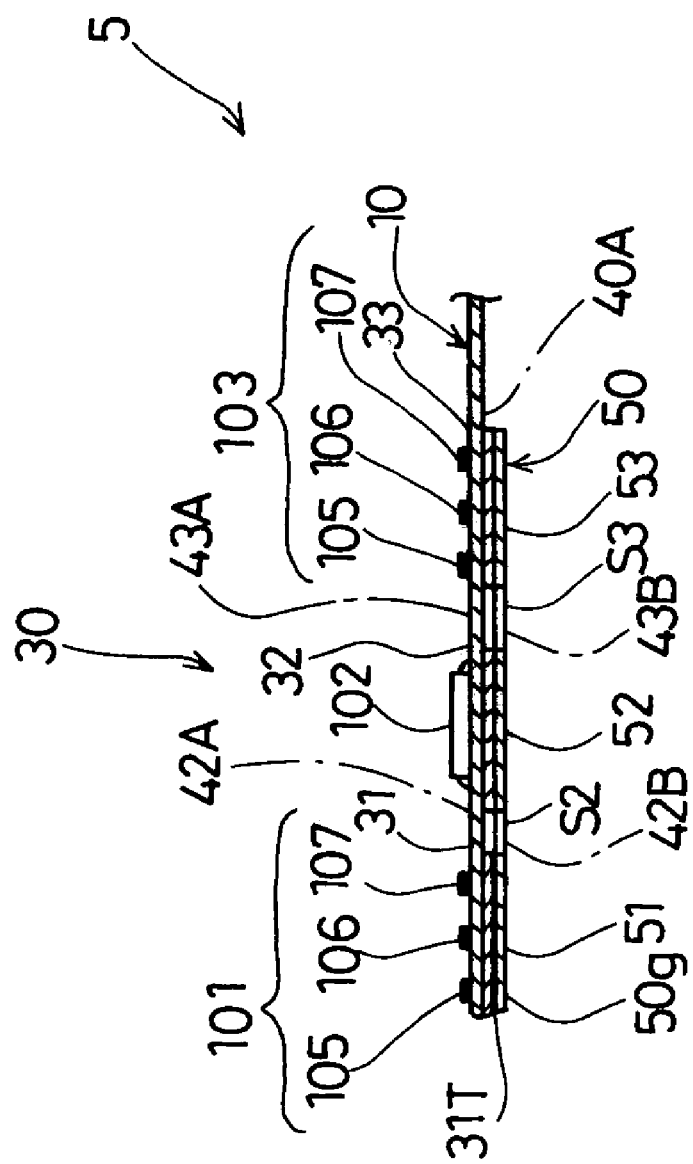
FIG. 10 is an explanatory diagram showing a state in which the sub-circuit portion is folded with respect to the main circuit portion according to the embodiment of the present invention.
Figure 11:
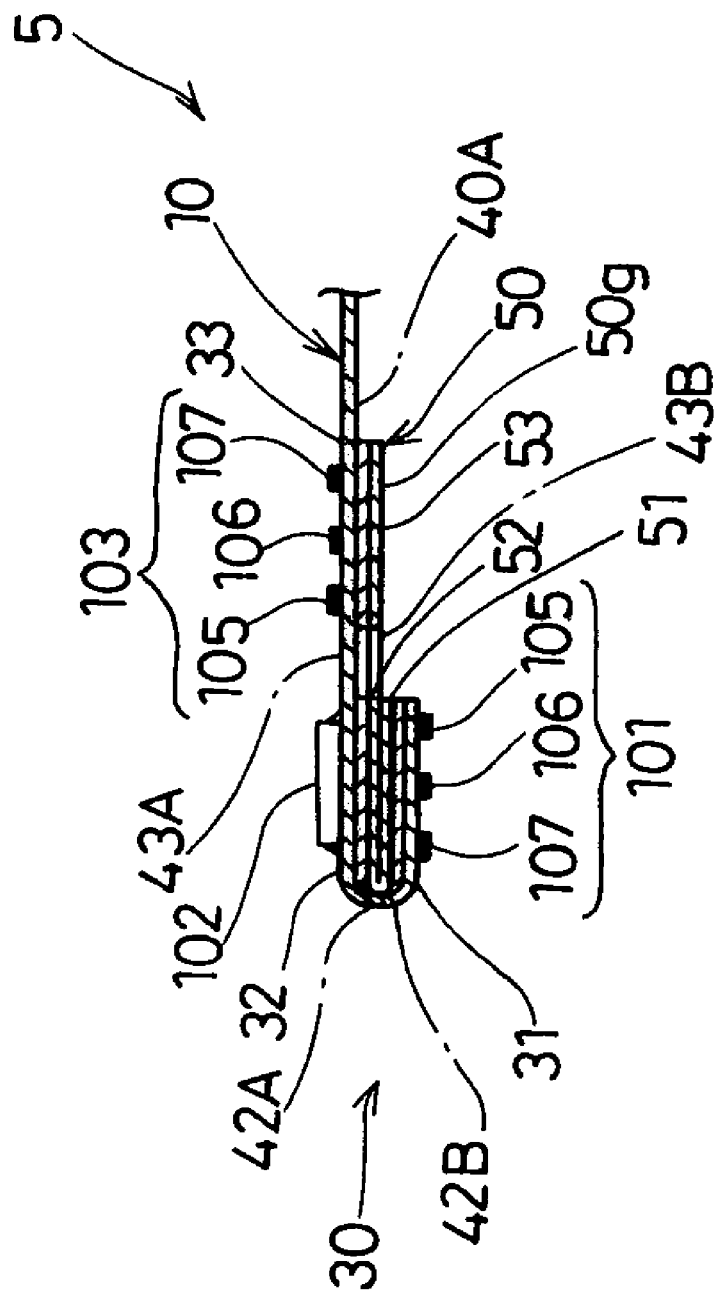
FIG. 11 is an explanatory diagram showing a state in which the first component-mounting segment is folded with respect to the second component-mounting segment according to the embodiment of the present invention.
Figure 12:
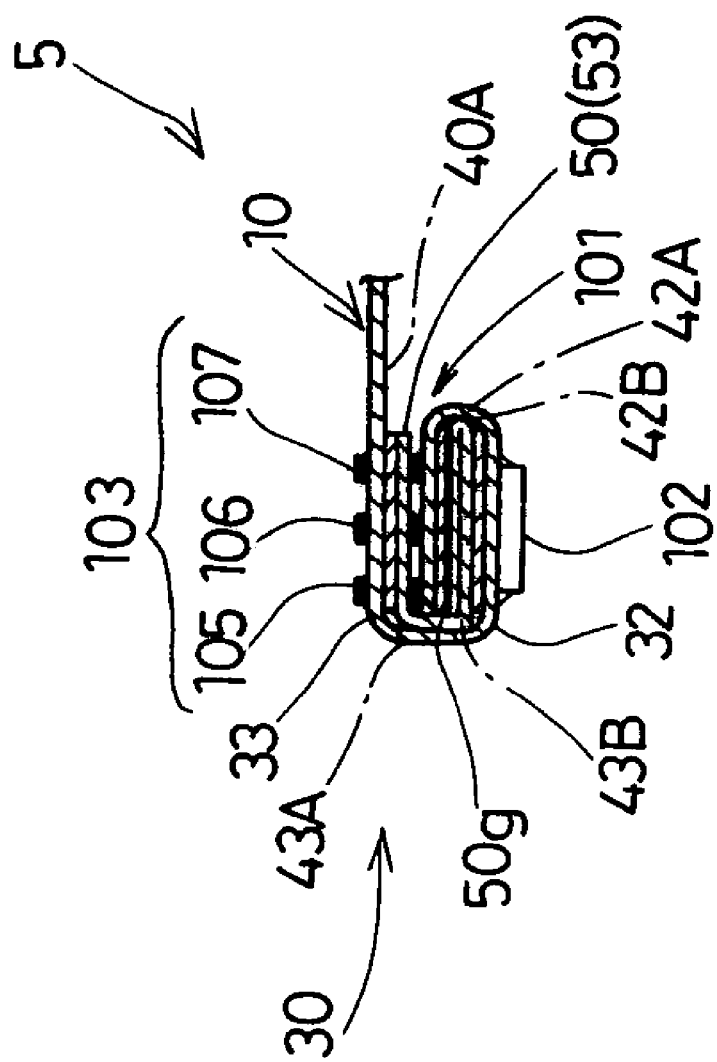
FIG. 12 is an explanatory diagram showing a state in which the second component-mounting segment is folded with respect to the third component-mounting segment according to the embodiment of the present invention.

In addition to components shown in FIG. 1, an optical pickup device 1, 1X comprises components which are not shown for clarity of the drawing. FIGS. 2-12 depict the essential portions of a flexible circuit member 5. In FIG. 3, blackened areas indicate the portions which are soldered, while other components are omitted for simplification of the drawing. In FIG. 4, areas shaded with dotted lines indicate the reinforcement plates, while other components are omitted for simplification of the drawing. FIG. 9 is a cross-sectional view taken along line A-A in FIG. 5. FIG. 10 is a cross-sectional view taken along line B-B in FIG. 6. FIG. 11 is a cross-sectional view taken along line C-C in FIG. 7. FIG. 12 is a cross-sectional view taken along line D-D in FIG. 8.

Figure 2:
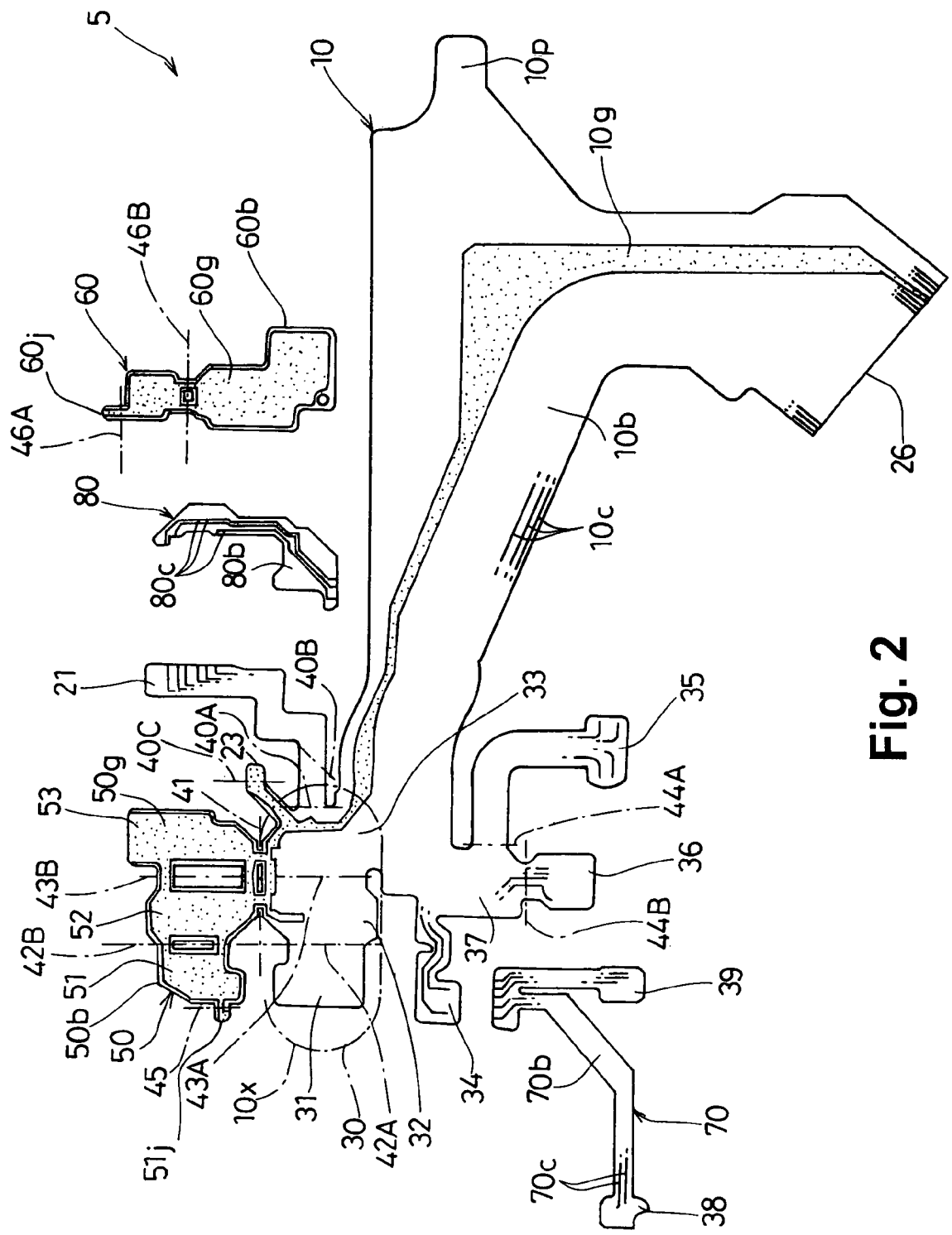
FIG. 2 is a plan view showing a flexible circuit member used in a first embodiment of the pickup device according to the present invention.
Figure 3:
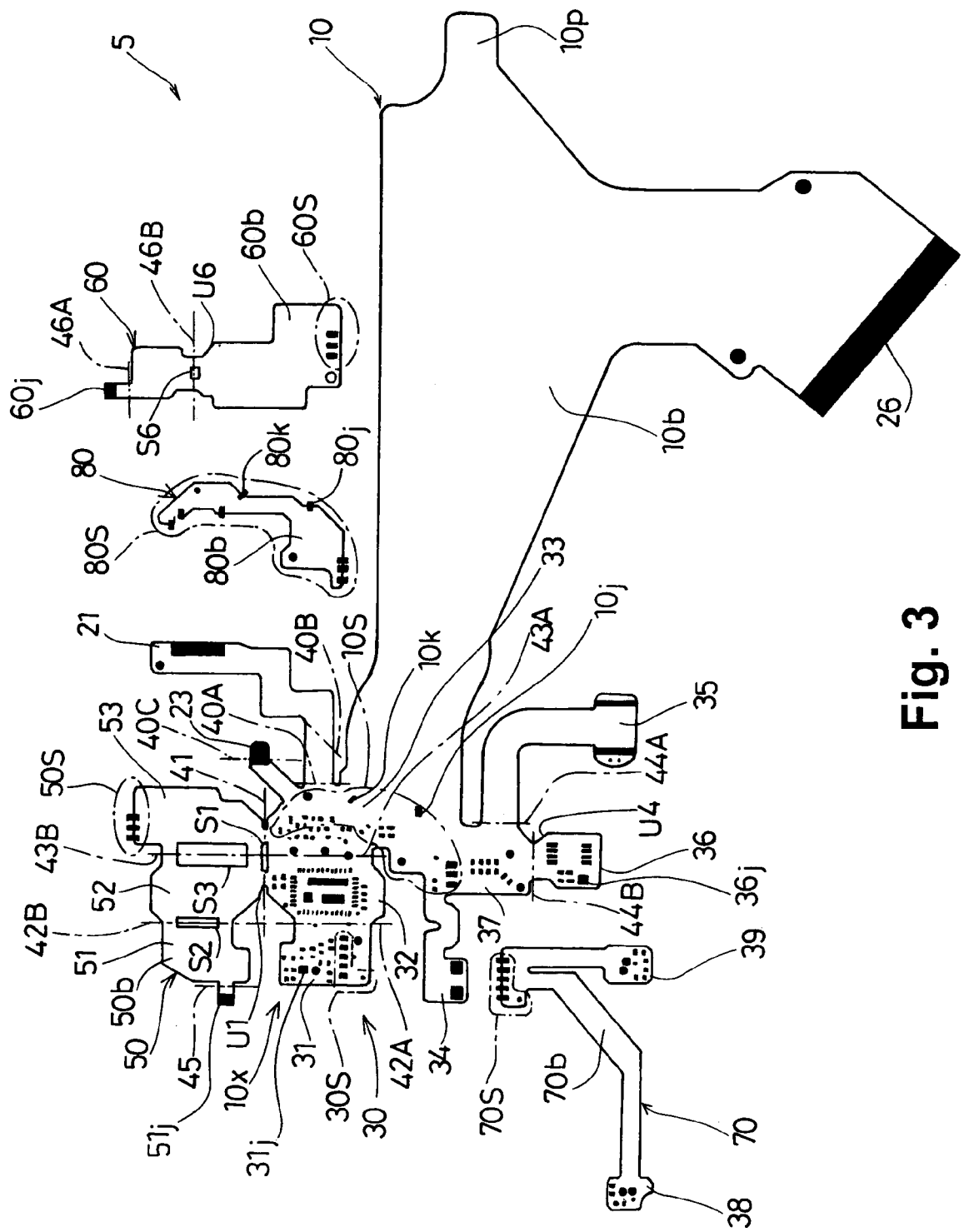
FIG. 3 is an explanatory diagram indicating soldered portions on the flexible circuit member according to the embodiment of the present invention.
Figure 4:
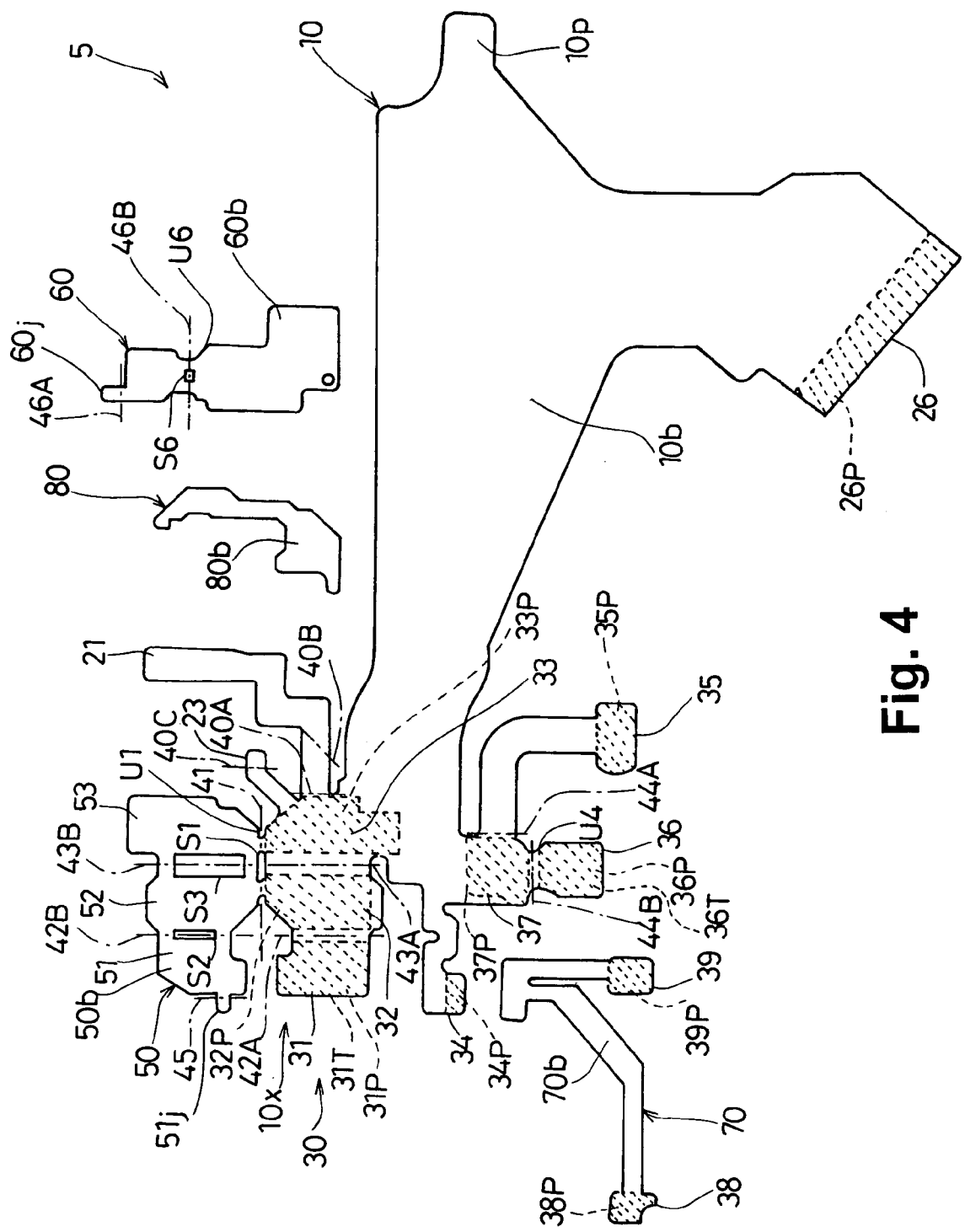
FIG. 4 is an explanatory diagram showing a state in which reinforcement plates are attached to the flexible circuit member according to the embodiment of the present invention.

The plan views shown in FIGS. 2-4 are referred to as the front or upper side of the flexible circuit member 5, while the opposite surface is referred to as the rear or lower side of the flexible circuit member 5. The terms "front", "rear", "upper", and "lower" are used in this specification by way of explanation only so as to clearly describe the flexible circuit member 5 of the optical pickup device 1.

An optical disc device (not shown) is used to reproduce data (such as information) recorded on an optical disc. Further, the optical disc device is also used to record data on an optical disc. Examples of the optical disc include read-only optical discs such as CD-ROM and DVD-ROM, write-once optical discs such as CD-R, DVD-R, and DVD+R, and writable/erasable or rewritable optical discs such as CD-RW, DVD-RW, DVD+RW, DVD-RAM, HD DVD, and Blu-ray Disc.

As described above, "CD" is an abbreviation of "compact disc". "DVD" is an abbreviation of "digital versatile disc" or "digital video disc". "ROM" in "CD-ROM" and "DVD-ROM" is an abbreviation of "read only memory". As such, CD-ROM and DVD-ROM are for reading only. "R" in "CD-R", "DVD-R", and "DVD+R" is an abbreviation of "recordable". As such, CD-R, DVD-R, and DVD+R are recordable. "RW" in "CD-RW", "DVD-RW", and "DVD+RW" is an abbreviation of "rewritable". As such, CD-RW, DVD-RW, and DVD+RW are rewritable. "DVD-RAM" is an abbreviation of "digital versatile disc random access memory", and denotes an optical disc that is readable, writable, and erasable.

"HD DVD" is an abbreviation of "High Definition DVD". An HD DVD has high compatibility with conventional DVDs while having a storage capacity larger than that of a conventional DVD-type optical disc. Whereas a red laser is used to read data from conventional CDs and DVDs, a blue-violet laser is used for an HD DVD type optical disc. Furthermore, according to the "Blu-ray" system, instead of red laser which is used to read and write signals on conventional CDs and DVDs, a blue-violet laser is used in order to achieve high-density recording.

An optical pickup 1 (FIG. 1) is configured as an optical head which is adapted for recording and reproducing signals on a disc (not shown) such as a CD and DVD. The optical pickup 1 is installed in an optical disc device which can perform reproduction and recording of data on a medium such as a CD and DVD. An optical disc such as a CD and DVD is placed on a turntable 2 inside the optical disc device. The optical pickup 1 is supported by a screw shaft 3 and a guide shaft 4 so as to be movable along the lengthwise direction D of the screw shaft 3 and the guide shaft 4. In other words, the optical pickup 1 is movable along the direction D which traverses the signal tracks formed in a substantially spiral shape on the optical disc not shown. The optical pickup is hereinafter abbreviated as "OPU".

A flexible circuit member 5 is provided extending from the upper surface of the OPU 1. The flexible circuit member 5 is extends out from the OPU 1 along the moving direction D of the OPU 1. The flexible circuit member 5 extending out from the OPU 1 is formed as a printed circuit member having high flexibility. The flexible printed circuit member is hereinafter abbreviated as "FPC".

The FPC 5 extending from the OPU 1 is loosely bent at a midway point and folded back, and is coupled to a circuit board 7 to enable electrical connection via a connector 6 provided on the circuit board 7. By coupling the connector 26 of the FPC 5 with the corresponding connector 6 of the circuit board 7, electrical connection from the OPU 1 to the circuit board 7 is made possible. As such, the FPC 5 is a flexible wiring board which serves as a transmission path connecting between the OPU 1 and the circuit board 7. The circuit board 7 is connected to the main functional unit within the optical disc device so as to perform transmission and reception of various signals.

While when the OPU 1 is being moved along the direction D traversing the signal track formed in a substantially spiral shape on the optical disc while the OPU 1 is being supported by the screw shaft 3 and the guide shaft 4, a main circuit portion 10 of the FPC 5 is made to bend loosely. In order to prevent the main circuit portion 10 of the FPC 5 from curving backwards and being jammed in surrounding components, a recurve prevention portion 10p is formed so as to protrude from the main circuit portion 10 of the FPC 5.

By forming the recurve prevention portion 10p protruding from the main circuit portion 10 of the FPC 5, it is ensured that, when the main circuit portion 10 of the FPC 5 is made to bend loosely, the recurve prevention portion 10p constantly abuts a substrate of a case constituting the optical disc device. In this manner, the main circuit portion 10 of the FPC 5 is prevented from being inadvertently jammed in surrounding components and thereby being damaged.

The OPU 1 is configured as an optical head comprising at least the FPC 5 to which electric/electronic components are coupled to achieve electrical connection, and a housing 1H on which the FPC 5, the electric/electronic components, and optical components are mounted.

The housing 1H maybe formed using an alloy containing aluminum which is a material having high corrosion resistance. When the housing 1H is formed using a nonferrous metal such as aluminum, rust generation on the housing 1H can be avoided, and heat can be favorably radiated from the housing 1H. Aluminum is a nonferrous metal having high corrosion resistance and a specific gravity that is smaller than that of iron. Alternatively, a synthetic resin housing may be favorably employed in place of a metal housing.

The FPC 5 comprises a main circuit portion 10 (FIGS. 2-4) on which various electric/electronic components are mounted in an electrically connected state, and a plurality of sub-circuit portions 50, 60, 70, 80 (FIGS. 2-4) which are employed while being connected to the main circuit portion 10.

As shown in FIG. 2, the main circuit portion 10 which constitutes the main body of the FPC 5 is formed by printing in parallel a plurality of circuit conductors 10c, 10g composed of a metal foil such as copper foil on a base 10b which is an insulating sheet made of polyimide resin, and further providing a protective layer on top. Polyimide may be abbreviated as "PI". The circuit conductors 10c, 10g are formed in a single layer alone with respect to the base 10b.

A first sub-circuit portion 50 of the FPC 5 is formed by printing a circuit conductor 50g composed of a metal foil such as copper foil on a base 50b which is an insulating sheet made of polyimide resin, and further providing a protective layer on top. The circuit conductor 50g is formed in a single layer alone with respect to the base 50b. The sub-circuit portion 50 is formed integrally with the main circuit portion 10 of the FPC 5, and comprises a first planar segment 51, second planar segment 52 continuously extending from the first planar segment 51, and third planar segment 53 continuously extending from the second planar segment 52.

Similarly as the first sub-circuit portion 50, a second sub-circuit member 60 which constitutes a part of the FPC 5 is formed by printing a circuit conductor 60g composed of a metal foil such as copper foil on a base 60b which is an insulating sheet made of polyimide resin, and further providing a protective layer on top. The circuit conductor 60g is formed in a single layer alone with respect to the base 60b.

A third sub-circuit member 70 which constitutes a part of the FPC 5 is formed by printing in parallel a plurality of circuit conductors 70c composed of a metal foil such as copper foil on a base 70b which is an insulating sheet made of polyimide resin, and further providing a protective layer on top. The circuit conductors 70c are formed in a single layer alone with respect to the base 70b.

Similarly as the third sub-circuit member 70, a fourth sub-circuit member 80 which constitutes a part of the FPC 5 is formed by printing in parallel a plurality of circuit conductors 80c composed of a metal foil such as copper foil on a base 80b which is an insulating sheet made of polyimide resin, and further providing a protective layer on top. The circuit conductors 80c are formed in a single layer alone with respect to the base 80b.

Only a single layer of circuit conductor is provided on each of the main circuit member 10 and sub-circuit members 50, 60, 70, 80 constituting the FPC 5. The thickness of the copper foil which forms a single layer of circuit conductor is approximately 70 μm. The main circuit member 10 and sub-circuit members 50, 60, 70, 80 constituting the FPC 5 have a thickness of approximately several ten to several hundred um, and have high flexibility. The circuit conductors 10g, 50g, 60g are formed as ground lines to be arranged on the grounding side.

In order to electrically connect the circuit conductors 10c, 10g, 50g, 60g, 70c, 80c (FIG. 2) to corresponding components, soldering is performed. The circuit conductors 10c, 10g, 50g, 60g, 70c, 80c are connected to circuits of the corresponding components. When soldering is performed, a sufficient level of heat resistance is required in the main circuit member 10 and sub-circuit members 50, 60, 70, 80. Accordingly, the bases 10b, 50b, 60b, 70b, 80b (FIGS. 3 and 4) are formed using a heat-resistant synthetic polymer which can tolerate the solder melting temperature attained during a soldering process. An example of heat-resistant synthetic polymer is polyimide resin, which has high heat resistance. Examples of FPC having a base composed of polyimide resin include Nitoflex (registered trademark) supplied by Nitto Denko Corporation, and Kapton (registered trademark) supplied by DUPONT-TORAY Co., Ltd.

Products of Nitoflex supplied by Nitto Denko Corporation include, for example, ultrafine FPC, ultrafine FPC (double-sided), micro-connection FPC, high insulation reliability FPC, high heat resistance FPC, and high flexibility FPC. Products of Kapton supplied by DUPONT-TORAY Co., Ltd. include, for example, H type, V type, Super V type, EN type, and KJ type. Kapton supplied by DUPONT-TORAY Co., Ltd. is nominally usable within a wide temperature range between a very low temperature of approximately −269° and a high temperature of approximately +400°.

As a soldering material, it is preferable to use a lead-free solder which does not contain lead for environmental reasons. By using a lead-free solder as the soldering material, negative influence on the natural environment due to lead can be avoided when discarding the OPU 1 (FIG. 1) or the FPC 5 (FIGS. 1, 3, 5) provided in the OPU 1. An example of a lead-free solder is ECO SOLDER M30 supplied by Senju Metal Industry Co., Ltd. An example of a reflow-type lead-free solder is ECO SOLDER L21 supplied by Senju Metal Industry Co., Ltd. Alternatively, a typical solder material may be used in place of the lead-free solder. Examples of typical solder materials include Sparkle Paste OZ series supplied by Senju Metal Industry Co., Ltd.

Electric/electronic components 101, 103 (FIG. 9) are LCRs for setting circuit constants. In "LCR", "L" stands for inductance coil, "C" stands for capacitor, and "R" stands for resistor. As shown in FIG. 9, each of LCRs 101, 103 is configured as a circuit comprising a coil 105, capacitor 106, and resistor 107. The coil 105, capacitor 106, and resistor 107 are electric/electronic components which constitute circuits such as a distributed constant circuit and a lumped constant circuit.

Further, an electric/electronic component 102 (FIG. 9) is configured as a laser-driving semiconductor integrated circuit, or laser driver (LDD), for supplying a current to a laser diode (LD) (not shown) so as to drive the laser diode.

Another electric/electronic component included in the OPU 1 but not shown is a light-emitting element which outputs a laser to an optical disc (not shown). The light-emitting element is a semiconductor laser, or laser diode (LD).

A further electric/electronic component is an optical detector (PDIC) for receiving the laser light reflected off of an optical disc such as a CD or DVD.

A still further electric/electronic component is a light-receiving element (not shown) used for maintaining, at a predetermined level, the amount of light output from the LD, not shown. The light-receiving element, or front monitor diode (FMD), is an element which receives a laser light output from an LD (not shown) for either one of CD and DVD.

Other electric/electronic components include a system controller (not shown) and a memory (not shown) which is electrically connected to the system controller. The system controller may comprise a CPU, microprocessor, or microcomputer. The system controller serves to perform system control over the entire optical disc device. "CPU" is an abbreviation of central processing unit.

Figure 5:
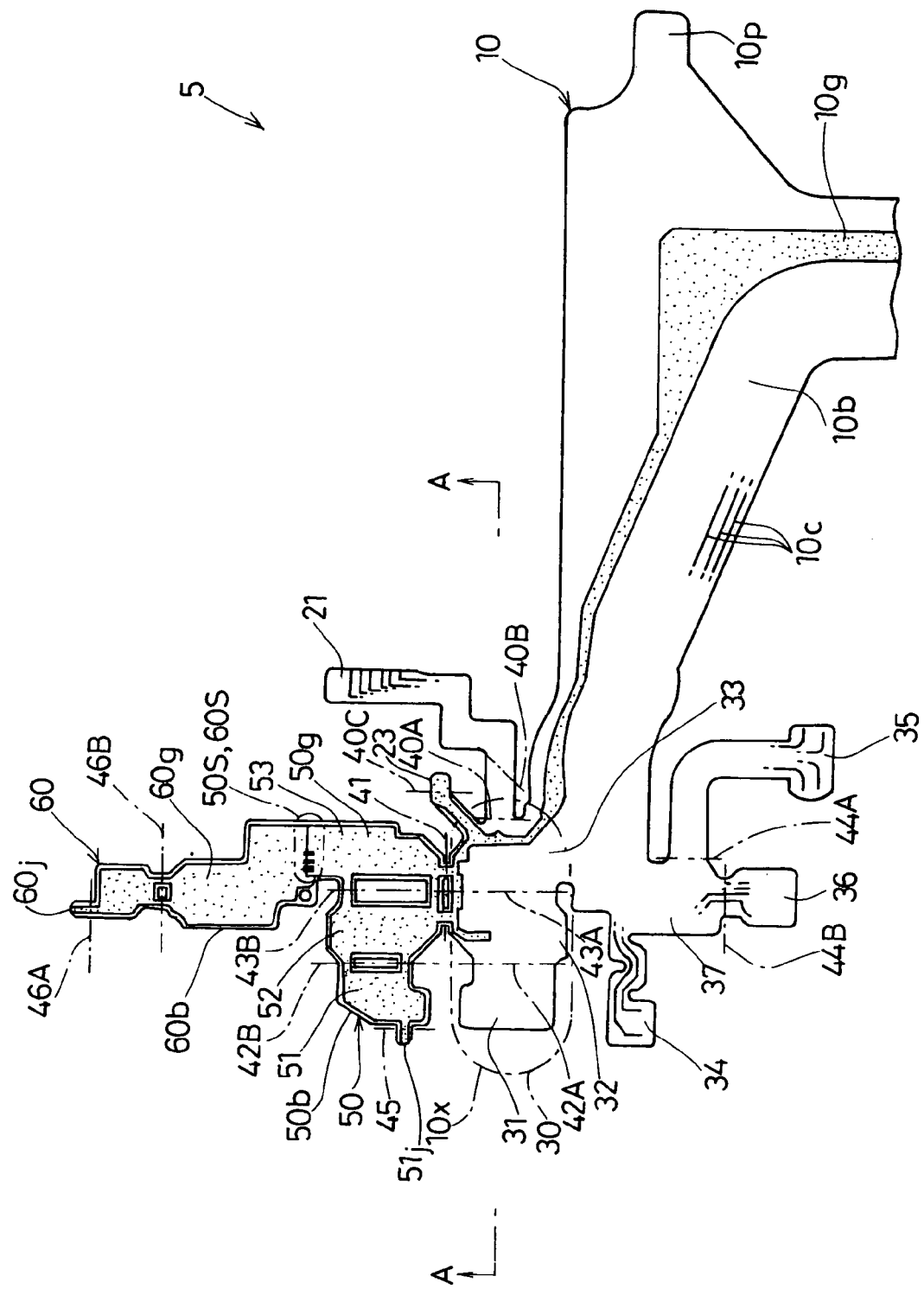
FIG. 5 is a plan view showing a state in which a second sub-circuit portion is soldered on a first sub-circuit portion of a main circuit portion according to the embodiment of the present invention.

As shown in FIGS. 2-4, the main circuit member 10 and the sub-circuit member 50 are integrally formed as a single member. The first sub-circuit member 50 and the second sub-circuit member 60 are preferably formed as separate entities. The first sub-circuit portion is embodied as the first sub-circuit member 50, while the second sub-circuit portion is embodied as the second sub-circuit member 60. The main circuit portion is configured as the main circuit member 10 which is formed integrally with the first sub-circuit member 50. The main circuit member 10 and the first sub-circuit member 50 are formed as a single unit, and the ground 50g of the first sub-circuit member 50 is connected to the ground 10g of the main circuit member 10. The ground 50g of the first sub-circuit member 50 and the ground 60g of the second sub-circuit member 60 are coupled to one another by soldering, as shown in FIG. 5, so as to achieve electrical connection. To explain in further detail, a solder portion 50S of the first sub-circuit member 50 shown in FIG. 3 is placed in contact with a solder portion 60S of the second sub-circuit member 60 shown in FIG. 3, and soldering is carried out in areas colored in black. In this manner, the first sub-circuit member 50 and the second sub-circuit member 60 are joined to allow electrical connection. As a result, the main circuit member 10 which includes the first sub-circuit member 50 is combined into a single unit with the second sub-circuit member 60.

A further soldering process is performed in order to attach the third sub-circuit member 70 and the fourth sub-circuit member 80 to the main circuit member 10. More specifically, a solder portion 30S of the main circuit member 10 (FIG. 3) is placed in contact with a solder portion 70S of the third sub-circuit member 70, and soldering is carried out in areas colored in black. In this manner, the main circuit member 10 and the third sub-circuit member 70 are joined to allow electrical connection. As the electric/electronic components attached to the third sub-circuit member 70, a plurality of laser diodes (LD) (not shown) are soldered thereon in a state which allows electrical connection.

Further, a solder portion 10S of the main circuit member 10 (FIG. 3) is placed in contact with a solder portion 80S of the fourth sub-circuit member 80, and soldering is carried out in areas colored in black. In this manner, the main circuit member 10 and the fourth sub-circuit member 80 are joined to allow electrical connection.

By soldering as described above, the main circuit member 10 which includes the first sub-circuit member 50 is combined into a single unit with the second sub-circuit member 60, the third sub-circuit member 70, and the fourth sub-circuit member 80. The soldering may be performed by the following method, for example. A cream-type reflow solder material is applied to corresponding portions of the items to be soldered. The items to be soldered are then placed inside a solder reflow tank. Inside the tank, the reflow solder is melted at a temperature within a range from approximately 240 to 250° C., and subsequently cooled gradually.

Figure 15:
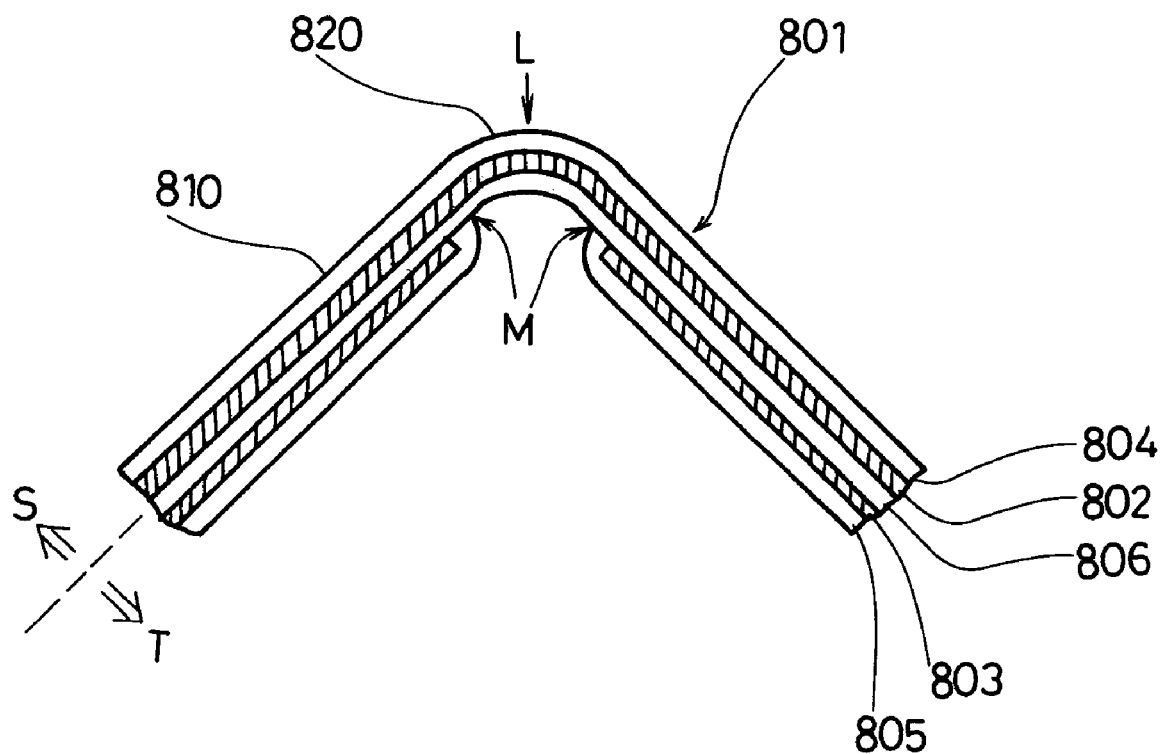
FIG. 15 is an explanatory diagram illustrating an example double-sided flexible printed circuit board according to background art.

It should be noted that the FPC 801 shown in FIG. 15 is formed without soldering and is configured as one integral unit which includes two conductive layers 802, 803.

Figure 6:
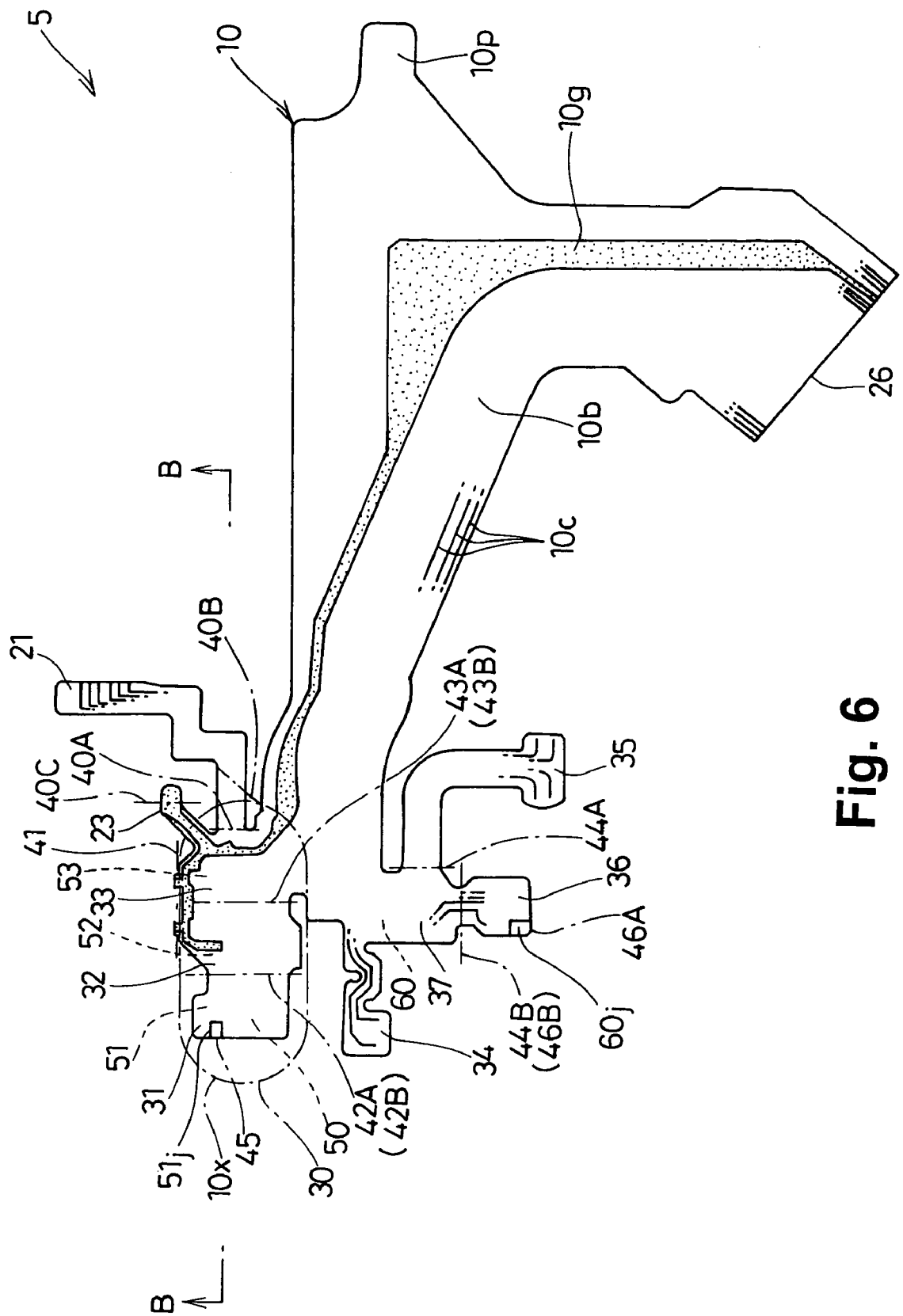
FIG. 6 is a plan view showing a state in which the sub-circuit portion is folded with respect to the main circuit portion according to the embodiment of the present invention.

At a folding portion 41 located at the boundary between the main circuit member 10 (FIGS. 2-5) and the first sub-circuit member 50, the sub-circuit member 50 is folded back with respect to the main circuit member 10. Accordingly, as shown in FIGS. 6 and 10, the main circuit member 10 and the sub-circuit members 50, 60 are positioned in an overlapping arrangement. More specifically, the combined sub-circuits 50, 60 shown in FIG. 5 are folded so as to be placed on the lower side of the main circuit member 10 (FIGS. 6, 9, and 10).

When the sub-circuits 50, 60 are folded with respect to the main circuit member 10 at the folding portion 41 (FIG. 5) so as to be placed on the lower side of the main circuit member 10, the lower side of a first reinforcement plate 31P is adhered to the first planar segment 51 of the first sub-circuit portion 50 by means of a double-coated adhesive tape 31T (FIGS. 4 and 9) disposed in advance on the underside of the first reinforcement plate 31P (FIG. 4). With this arrangement, the main circuit member 10 and the first sub-circuit portion 50 can be accurately held in positional alignment (FIGS. 6 and 10). Furthermore, the lower side of a sixth reinforcement plate 36P is adhered to the second sub-circuit portion 60 (FIG. 5) by means of a double-coated adhesive tape 36T disposed in advance on the underside of the sixth reinforcement plate 36P (FIG. 4). With this arrangement, the main circuit member 10 and the second sub-circuit portion 60 can be accurately held in positional alignment (FIG. 6). One example of double-coated adhesive tape is the double-strength double-coated cellophane tape "CEL-TACK" (registered trademark) CW-D15 supplied by NICHIBAN Co., Ltd. Alternatively, a binder material such as an adhesive may be favorably used in place of the double-coated adhesive tape. Double-coated adhesive tapes and adhesives are examples of binder materials.

A region surrounding the portion at which the LDD 102 (FIG. 9) is mounted on the second component-mounting segment 32 of the FPC 5 (FIGS. 2-5) is referred to as a signal-crowding region 10*x* (FIGS. 2 and 5) because one or both of analog and digital signals are present in that region in a concentrated manner. The first component-mounting segment 31, second component-mounting segment 32, and third component-mounting segment 33 are included in the signal-crowding region 10*x*.

In order to position a single grounding layer of sub-circuit portion 50 over the entire lower side of the signal-crowding region 10*x* (FIGS. 2 and 5), the combined sub-circuit members 50, 60 (FIG. 5) are folded toward the underside of the main circuit portion 10 (as shown in FIG. 6) at the folding portion 41 which corresponds to the boundary between the main circuit member 10 and the first sub-circuit member 50. With this arrangement, the S/N ratio of the entire signal-crowding region 10*x* of the main circuit portion 10 can be improved, thereby achieving noise reduction in the entire signal-crowding region 10*x* of the main circuit portion 10.

Further, generation of crosstalk in the signal-crowding region 10*x* of the main circuit portion 10 can be minimized. Crosstalk refers to a leak of a signal transmitting through a channel to a separate channel. In order to facilitate folding at the folding portion 41, the folding portion 41 is designed to include a slit S1 and a notch U1 as depicted in FIGS. 3 and 4.

The component-mounting segment 30 of the main circuit portion 10 on which the electric/electronic components 101, 103 are mounted is folded while being laminated with the ground 50*g* of the sub-circuit portion 50. Accordingly, the S/N of analog signals transmitted around the electric/electronic components 101, 103 can be improved. Further, with the above-described arrangement, radiation with respect to the electric/electronic components 101, 103 can be minimized. As a result, noise generation in the flexible circuit member 5 and erroneous operations of the pickup device 1 can be prevented.

More specifically, it is possible to prevent the electric/electronic components 101, 103 mounted on the main circuit portion 10 of the flexible circuit member 5 from being subjected to the influences of noise, and therefore any abnormal operations of the electric/electronic components 101, 103 caused by such influences can be avoided. When the sub-circuit portions 50, 60 of the flexible circuit member 5 are folded with respect to the main circuit portion 10 of the flexible circuit member 5 so as to place the main circuit portion 10 and the sub-circuit portions 50, 60 in an overlapping arrangement, the sub-circuit portions 50, 60 may be soldered to the main circuit portion 10 so as to electrically connect the main circuit portion 10 and the sub-circuit portions 50, 60. According to this arrangement, it is possible to prevent noise from influencing the electric/electronic components 101, 103 provided on the main circuit portion 10.

Figure 7:
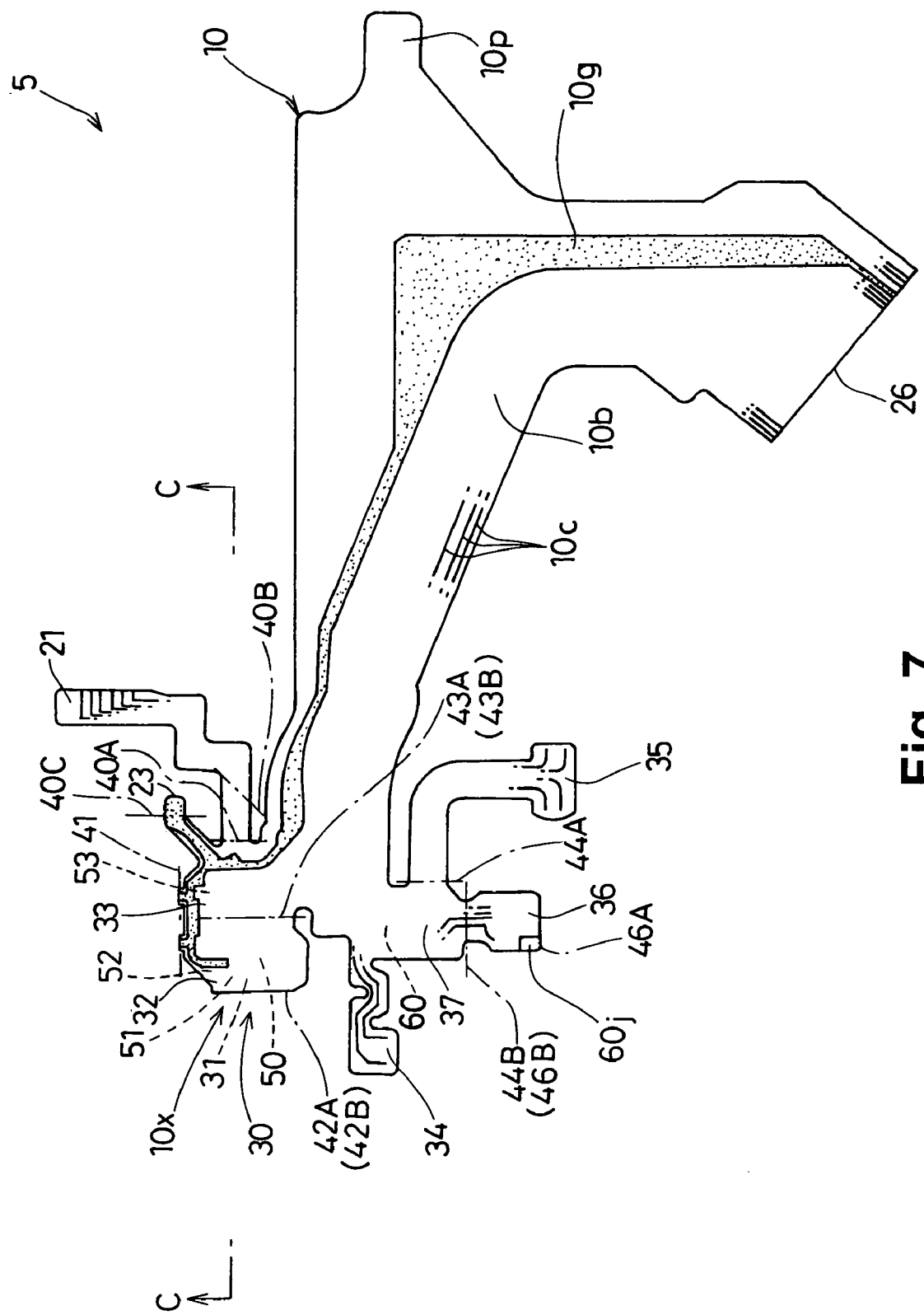
FIG. 7 is a plan view showing a state in which a first component-mounting segment is folded with respect to a second component-mounting segment in the main circuit portion according to the embodiment of the present invention.
Figure 8:
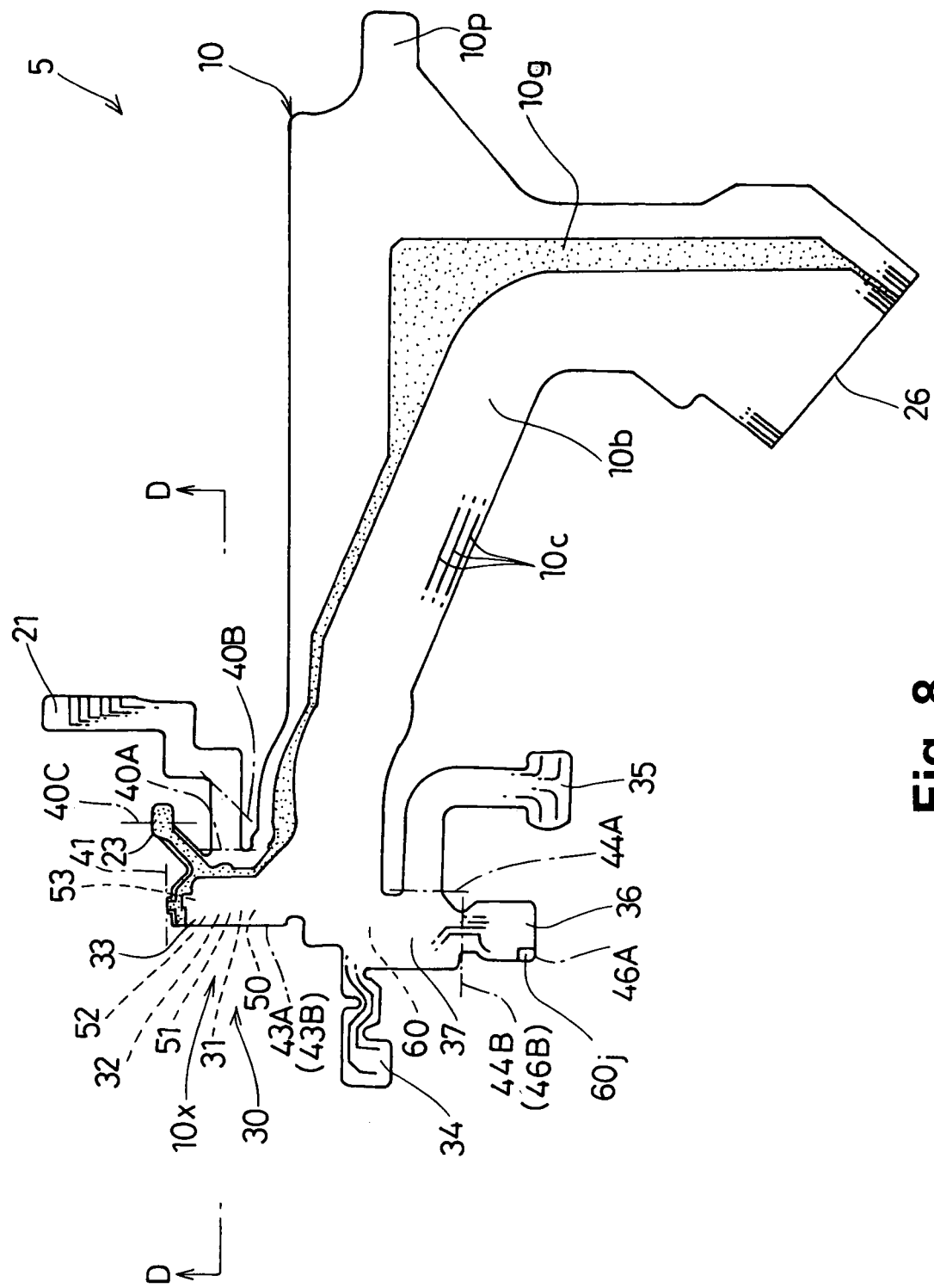
FIG. 8 is a plan view showing a state in which the second component-mounting segment is folded with respect to a third component-mounting segment in the main circuit portion according to the embodiment of the present invention.

After folding at the folding portion 41 of the FPC 5, other folding portions 40A, 40B, 40C, 42A, 42B, 43A, 43B, 44A, 44B, 45,46A, and 46B of the FPC 5 shown in FIGS. 2-8 are each held in a folded state (as shown in FIGS. 8 and 12), and the FPC 5 is mounted on the housing 1H so as to assemble the OPU 1.

According to this configuration, while only a single layer of circuit conductor is formed in the FPC 5, the FPC 5 (FIGS. 1-12) can be employed in a state in which GND is reinforced to a level substantially equivalent to that of the costly FPC 801 which includes two conductive layers 802, 803 (FIG. 15) formed into one integral unit. Because GND reinforcement is implemented in the FPC 5 configured as described above, the S/N ratio of electric signals transmitted in the FPC 5 can be improved.

Further, according to the above configuration, isolation between digital signals and analog signals in the FPC 5 can be accomplished. Isolation refers to prevention of current flow between two points of communication. By achieving isolation between digital signals and analog signals transmitted in the FPC 5, the S/N ratio of electric signals transmitted in the FPC 5 can be improved.

Moreover, cost increases can be minimized because the FPC 5 (FIGS. 1-12) including only a single layer of circuit conductor is employed, eliminating the need to use the costly FPC 801 which includes two conductive layers 802, 803 (FIG. 15) formed into one integral unit.

The first sub-circuit member 50 is provided for preventing signals of the LDD 102 (FIG. 9) mounted on the component-mounting segment 32 of the main circuit member 10 (FIG. 2-5) from interfering with the signal-crowding region 10*x* (FIGS. 2 and 5) of the main circuit member 10 and thereby causing malfunctions in the electric/electronic components such as the LCRs 101, 103 (FIG. 9) disposed in the signal-crowding region 10x.

The second sub-circuit member 60 (FIG. 2-5) is provided for preventing signals of the PDIC mounted on the component-mounting segment 35 of the main circuit member 10 and signals of the FMD mounted on the component-mounting segment 34 of the main circuit member 10 from interfering with the signal-crowding region 10x (FIGS. 2 and 5) of the main circuit member 10 and thereby causing malfunctions in the electric/electronic components such as the LCRs 101, 103 (FIG. 9) disposed in the signal-crowding region 10x.

The third sub-circuit member 70 (FIG. 2-4) is provided for electrically connecting to the main circuit member 10 the LD (not shown) for CD which is mounted on one component-mounting segment 38 of the third sub-circuit member 70 and the LD (not shown) for DVD which is mounted on the other component-mounting segment 39 of the third sub-circuit member 70.

The fourth sub-circuit member 80 (FIG. 2-4) is not connected to any specific circuit conductor 10c (FIGS. 2 and 5-8) of the main circuit member 10 but is provided for connecting between one terminal 10j (FIG. 3) of the main circuit member 10 and another terminal 10k of the main circuit member 10.

Reinforcement plates 31P, 32P, 33P, 34P, 35P, 36P, 37P, 38P, and 39P (FIG. 4) corresponding to the respective electric/electronic components noted above are provided on the rear side of the FPC 5. The reinforcement plates 31P-39P are attached to the rear side of the FPC 5 by means of a binder material such as the above-noted double-coated adhesive tape and an adhesive. The reinforcement plates 31P-39P define, on the main circuit member 10, the component-mounting segments 31, 32, 33, 34, 35, 36, 37, 38, and 39 for mounting the electric/electronic components. As such, in the FPC 5, the component-mounting segments 31-39 for mounting the electric/electronic components are provided corresponding to the respective reinforcement plates 31P-39P.

To explain in further detail, the main circuit member 10 comprises the first component-mounting segment 31 (FIGS. 2-4) on which the first electric/electronic component 101 (FIG. 9) is arranged. The first electric/electronic component 101 constitutes the LCR 101. The LCR 101 is an electric/electronic component group which includes a coil 105, capacitor 106, and resistor 107 collectively arranged in one location. In order to facilitate soldering when forming the LCR 101 on the first component-mounting segment 31, the first reinforcement plate 31P is provided on the rear side of the first component-mounting segment 31 of the main circuit portion 10, as shown in FIGS. 4 and 9. The first reinforcement plate 31P (FIG. 4) serves as the underlay (FIGS. 4 and 9) while the coil 105 (FIG. 9), capacitor 106, resistor 107, and the like are being soldered by means of a soldering material onto the first component-mounting segment 31 (FIGS. 2-5) of the main circuit member 10. The double-coated adhesive tape 31T is attached on the underside of the first reinforcement plate 31P such that the first reinforcement plate 31P can be adhered to the first sub-circuit portion 50.

The main circuit member 10 further comprises the second component-mounting segment 32 (FIGS. 2-4) on which the second electric/electronic component 102 (FIG. 9) is arranged. The second electric/electronic component 102 corresponds to the LDD 102. In order to facilitate mounting of the LDD 102 and the like on the second component-mounting segment 32 by soldering, the second reinforcement plate 32P is provided on the rear side of the second component-mounting segment 32 of the main circuit portion 10, as shown in FIGS. 4 and 9. The second reinforcement plate 32P (FIG. 4) serves as the underlay (FIGS. 4 and 9) while the LDD 102 and the like are being soldered by means of a soldering material onto the second component-mounting segment 32 (FIGS. 2-5) of the main circuit member 10.

The main circuit member 10 further comprises the third component-mounting segment 33 (FIGS. 2-4) on which the third electric/electronic component 103 (FIG. 9) is arranged. The third electric/electronic component 101 constitutes the LCR 103. The LCR 103 is an electric/electronic component group which includes a coil 105, capacitor 106, and resistor 107 collectively arranged in one location. In order to facilitate soldering when forming the LCR 103 on the third component-mounting segment 33, the third reinforcement plate 33P is provided on the rear side of the third component-mounting segment 33 of the main circuit portion 10, as shown in FIGS. 4 and 9. The third reinforcement plate 33P (FIG. 4) serves as the underlay (FIGS. 4 and 9) while the coil 105 (FIG. 9), capacitor 106, resistor 107, and the like are being soldered by means of a soldering material on the third component-mounting segment 33 (FIGS. 2-5) of the main circuit member 10.

The FMD (not shown) is mounted on the component-mounting segment 34 of the main circuit portion 10 (FIGS. 2-4). In order to facilitate mounting of the FMD on the fourth component-mounting segment 34 by soldering, the fourth reinforcement plate 34P is provided on the rear side of the fourth component-mounting segment 34 of the main circuit portion 10, as shown in FIG. 4. The fourth reinforcement plate 34P serves as the underlay (FIG. 4) while the FMD is being soldered by means of a soldering material on the fourth component-mounting segment 34 (FIGS. 2-5) of the main circuit member 10.

The PDIC (not shown) is mounted on the component-mounting segment 35 of the main circuit portion 10 (FIGS. 2-4). In order to facilitate mounting of the PDIC on the fifth component-mounting segment 35 by soldering, the fifth reinforcement plate 35P is provided on the rear side of the fifth component-mounting segment 35 of the main circuit portion 10, as shown in FIG. 4. The fifth reinforcement plate 35P serves as the underlay (FIG. 4) while the PDIC is being soldered by means of a soldering material on the fifth component-mounting segment 35 (FIGS. 2-5) of the main circuit member 10.

The memory (not shown) is mounted on the component-mounting segment 36 of the main circuit portion 10 (FIGS. 2-4). An EEPROM may be employed as the memory. An EEPROM refers to a non-volatile memory in the form of a ROM in which the content can be electrically rewritten. A voltage higher than a normal voltage is used to change the content of an EEPROM. Further, an EEPROM is a memory in which stored information can be electrically erased. "EEPROM" is an abbreviation of "electronically erasable and programmable read only memory".

In order to facilitate mounting of the memory on the sixth component-mounting segment 36 by soldering, the sixth reinforcement plate 36P is provided on the rear side of the sixth component-mounting segment 36 of the main circuit portion 10, as shown in FIG. 4. The sixth reinforcement plate 36P serves as the underlay (FIG. 4) while the EEPROM is being soldered by means of a soldering material onto the sixth component-mounting segment 36 (FIGS. 2-5) of the main circuit member 10. The double-coated adhesive tape 36T is attached on the underside of the sixth reinforcement plate 36P such that the sixth reinforcement plate 36P can be adhered to the second sub-circuit portion 60.

The main circuit member 10 further comprises the seventh component-mounting segment 37 (FIGS. 2-4) on which the seventh electric/electronic component (not shown) is arranged. Similarly as the first 101 and the third 103 electric/electronic components, the seventh electric/electronic component constitutes an LCR. In order to facilitate soldering when forming the LCR on the seventh component-mounting segment 37, the seventh reinforcement plate 37P is provided on the rear side of the seventh component-mounting segment 37 of the main circuit portion 10, as shown in FIG. 4. The seventh reinforcement plate 37P serves as the underlay (FIG. 4) while a coil, capacitor 106, resistor 107, and the like are being soldered by means of a soldering material onto the seventh component-mounting segment 37 (FIGS. 2-5) of the main circuit member 10.

In order to facilitate insertion and removal of the connector 26 of the main circuit portion 10 (FIGS. 1-4) with respect to the corresponding connector 6 (FIG. 1), a reinforcement plate 26P is provided on the connector 26 of the main circuit portion 10. The reinforcement plate 26P is adhered on the rear side of the main circuit portion 10 by means of a binder material such as a double-coated adhesive tape or an adhesive.

An actuator (not shown) for driving a lens holder (not shown) of the OPU 1 is coupled to a terminal 21 of the main circuit portion 10 (FIGS. 2-4) such that electrical connection is possible.

The LD (not shown) for CD is mounted on one component-mounting segment 38 of the third sub-circuit member 70 (FIGS. 2-4). In order to facilitate mounting of the LD for CD on the one component-mounting segment 38 by soldering, the reinforcement plate 38P is provided on the rear side of the component-mounting segment 38 of the third sub-circuit member 70, as shown in FIG. 4. The reinforcement plate 38P serves as the underlay (FIG. 4) while the LD for CD is soldered by means of a soldering material onto the component-mounting segment 38 (FIGS. 2-4) of the third sub-circuit member 70.

The LD (not shown) for DVD is mounted on the other component-mounting segment 39 of the third sub-circuit member 70 (FIGS. 2-4). In order to facilitate mounting of the LD for DVD on the other component-mounting segment 39 by soldering, the reinforcement plate 39P is provided on the rear side of the component-mounting segment 39 of the third sub-circuit member 70, as shown in FIG. 4. The reinforcement plate 39P serves as the underlay (FIG. 4) while the LD for DVD is being soldered by means of a soldering material on the component-mounting segment 39 (FIGS. 2-4) of the third sub-circuit member 70.

The third sub-circuit member 70 (FIGS. 2-4) having the LD for CD and the LD for DVD mounted thereon is coupled to the main circuit member 10 for electrical connection.

By performing soldering, the above-noted electric/electronic components are fixed on the respective component-mounting segments each having a reinforcement plate attached thereon. When soldering is performed, a sufficient level of heat resistance is required in the reinforcement plates 31P, 32P, 33P (FIGS. 4 and 9), 34P, 35P, 36P, 37P, 38P, and 39P (FIG. 4) attached to the main circuit member 10. Similarly, a sufficient level of heat resistance is required in the reinforcement plates 38P and 39P of the third sub-circuit member 70 when soldering is performed.

For this reason, the reinforcement plates 31P-39P are composed of polyimide resin having high heat resistance. The reinforcement plate 26P provided on the connector 26 is similarly formed using polyimide resin because a solder plating processing is performed on the connector 26. As the reinforcement plates, it is possible to employ a material comprising heat-resistant synthetic polymers such as polyimide resins, epoxy resins, and polyester resins. An example of reinforcement plate made of a thermoplastic polyester resin is FB-ML11A supplied by Nitto Denko Corporation.

The temperature at which the soldering process is performed is within a temperature range from approximately 240 to 250° C. Accordingly, the components constituting the FPC 5 should preferably be composed of materials which are resistant to heat higher than the soldering temperature. For example, it is preferable to form molded pieces using a polyimide resin having a heat-resistance temperature higher than approximately 260°. Polyimide resin has high heat resistance, and is suitable for use as an underlay when performing a soldering process. As the heat-resistant synthetic polymers, it is also preferable to select polymers having a heat-resistance temperature higher than the melting point of the solder.

The polyimide resin reinforcement plates 26P and 31P-39P are adapted to tolerate the solder melting temperature attained when the soldering process is performed on the reinforcement plates 26P and 31P-39P.

The reinforcement plates 26P and 31P-39P have a thickness of several hundred μm. Preferably, all of the reinforcement plates 26P and 31P-39P have a uniform thickness. When the thickness of all of the reinforcement plates 26P and 31P-39P are made uniform, the reinforcement plates 26P and 31P-39P can be efficiently fabricated by die-cutting from a single standard-sized sheet.

In order to allow the electric/electronic components to be accurately positioned on the component-mounting segments 30-39, the reinforcement plates 31P-39P attached to the FPC 5 (FIG. 4) are provided on the rear side of the FPC 5. The reinforcement plate 26P is also provided on the rear side of the connector 26 of the FPC 5.

By providing the reinforcement plates 31P-37P on the main circuit member 10 which constitutes the FPC 5, various electric/electronic components can be easily soldered on the component-mounting segments 30-37 of the main circuit member 10. The reinforcement plates 31P-37P serve as the underlay while various electric/electronic components are being mounted on the component-mounting segments 30-37 of the main circuit member 10 by means of a solder material. With this arrangement, the electric/electronic components can be efficiently and accurately soldered on the component-mounting segments 30-37 of the main circuit member 10.

Further, by providing the reinforcement plates 38P and 39P on the third sub-circuit member 70 which constitutes a part of the FPC 5, the LD for CD and the LD for DVD can be easily soldered on the component-mounting segments 38, 39 of the third sub-circuit member 70. The reinforcement plates 38P, 39P serve as the underlay while the LD for CD and the LD for DVD are being mounted on the component-mounting segments 38, 39 of the third sub-circuit member 70 by means of a solder material. With this arrangement, the LD for CD and the LD for DVD can be efficiently and accurately soldered on the component-mounting segments 38, 39 of the third sub-circuit member 70.

When the LD for CD and the LD for DVD can be efficiently and accurately mounted on the component-mounting segments 38, 39 of the third sub-circuit member 70, production efficiency and assembly efficiency of the FPC 5 is enhanced, thereby achieving reduction in manufacturing costs of the FPC 5.

Further, because the component-mounting segments 31, 32, 33, 36, and 37 on which various electric/electronic components are mounted are defined on the main circuit member 10 based on the reinforcement plates 31P, 32P, 33P, 36P, and 37P, the folding process of the main circuit member 10 constituting the FPC 5 can be easily performed. Because of the reinforcement plates 31P, 32P, 33P, 36P, 37P provided on the main circuit member 10, the FPC 5 can be easily folded to a moderate degree.

More specifically, the portions of the main circuit member 10 of the FPC 5 provided with the reinforcement plates 31P, 32P, 33P, 36P, 37P become reinforced to have higher stiffness compared to other portions. Accordingly, by providing the reinforcement plates 31P, 32P, 33P, 36P, 37P on the main circuit member 10 of the FPC 5, the main circuit member 10 of the FPC 5 is separated into stiff portions and flexible portions. As such, the process of folding segments such as the first component-mounting segment 31, second component-mounting segment 32, and sixth component-mounting segment can be easily performed.

When various electric/electronic components can be accurately and efficiently mounted on the component-mounting segments 31, 32, 33, 36, 37 of the main circuit member 10 constituting the FPC 5, and the folding process of the FPC 5 is facilitated, production efficiency and assembly efficiency of the FPC 5 is enhanced. The FPC 5 can thereby be fabricated at a lower cost, allowing provision of the OPU 1 at a minimized cost.

The component-mounting segment 30 which constitutes the signal-crowding region 10x of the main circuit portion 10 (FIGS. 2 and 5) is folded (as shown in FIGS. 7, 8, 11, 12) while being laminated with the ground 50g of the sub-circuit portion 50 (as shown in FIGS. 6 and 10).

By configuring in this manner, while only a single layer of circuit conductor is formed in the FPC 5, the single-sided FPC 5 can exhibit GND performance that is substantially equivalent to that of the costly FPC 801 which includes two conductive layers 802, 803 (FIG. 15) formed into one integral unit. When the component-mounting segment 30 of the main-circuit portion 10 on which various electric/electronic components 101, 102, 103, 105, 106, 107 (FIG. 9) are mounted is folded (as shown in FIGS. 7, 8, 11, 12) while being laminated with the ground 50g of the sub-circuit portion 50 (as shown in FIGS. 6 and 10), the S/N ratio of electric signals transmitted in areas around the electric/electronic components 101, 102, 103, 105, 106, 107 can be improved.

Further, when the component-mounting segment 30 of the main circuit portion 10 on which various electric/electronic components 101, 102, 103, 105, 106, 107 are mounted is folded while being laminated with the ground 50g of the sub-circuit portion 50, radiation with respect to the electric/electronic components 101, 102, 103, 105, 106, 107 can be minimized. As a result, noise generation in the signal-crowding region 10x (FIGS. 2, 5, and 6) of the FPC 5 and erroneous operations of the OPU 1 (FIG. 1) can be prevented.

The component-mounting segment 30 which constitutes the signal-crowding region 10x of the main circuit portion 10 (FIGS. 2-4) includes the first component-mounting segment 31 on which the LCR 101 (FIG. 9) is arranged. Corresponding to the first component-mounting segment 31, the ground 50g of the sub-circuit portion 50 includes the first planar segment 51. The component-mounting segment 30 further includes the second component-mounting segment 32 on which the LDD 102 (FIG. 9) is arranged. Corresponding to the second component-mounting segment 32, the ground 50g of the sub-circuit portion 50 includes the second planar segment 52. As shown in FIGS. 6, 7, 10, and 11, the first component-mounting segment 31 is folded with respect to the second component-mounting segment 32 while the first planar segment 51 and the second planar segment 52 are placed on top of one another.

The first component-mounting segment 31 is folded with respect to the second component-mounting segment 32 (FIGS. 7 and 11) at the folding portions 42A and 42B (FIGS. 6 and 10). More specifically, the folding portion 42A is located at the boundary between the first component-mounting segment 31 and the second component-mounting segment 32 of the main circuit member 10 (FIGS. 6 and 10). At this folding portion 42A, the first component-mounting segment 31 is folded with respect to the second component-mounting segment 32 (FIG. 11). Simultaneously, at the folding portion 42B located at the boundary between the first planar segment 51 and the second planar segment 52 of the sub-circuit member 50 (FIGS. 4, 6, and 10), the first planar segment 51 is folded with respect to the second planar segment 52 such that the first planar segment 51 and the second planar segment 52 are placed overlapping one another (FIG. 11). The component-mounting segment 31 (FIG. 10) is therefore swung to be positioned under the second component-mounting segment 32 (FIG. 11).

According to this arrangement, the S/N of analog signals transmitted around the second component-mounting segment 32 can be improved. A shielding effect is exhibited by the ground 50g of the sub-circuit member 50 interposed between the first component-mounting segment 31 and the second component-mounting segment 32, which improves the S/N of analog signals transmitted around the second component-mounting segment 32. Further, because the first planar segment 51 and the second planar segment 52 which constitute the ground 50g of the sub-circuit member 50 are laminated on one another, it is possible to minimize radiation with respect to the electric/electronic components 101 on the first component-mounting segment 31 and the electric/electronic components 102 on the second component-mounting segment 32.

More specifically, the S/N ratio of low-power analog signals transmitted around the LDD 102 can be improved. A shielding effect is exhibited by the ground 50g of the sub-circuit member 50 interposed between the LCR 101 and the LDD 102, which improves the S/N ratio of analog signals transmitted around the second component-mounting segment 32. Further, because the first planar segment 51 and the second planar segment 52 which constitute the ground 50g of the sub-circuit member 50 are placed in an overlapping arrangement with one another, radiation of magnetic waves or the like with respect to the LCR 101 and the LDD 102 can be minimized.

According to the above-described arrangement, while the FPC 5 comprises circuit conductors 10c, 10g, 50g, 60g, 70c, and 80c formed in only a single layer, the FPC 5 exhibits an S/N characteristic that is substantially equivalent to that of the FPC 801 which includes two conductive layers 802, 803 (FIG. 15) formed into one integral unit. As a result, it is possible to prevent erroneous operations of the OPU 1 (FIG. 1) from being caused by noise generated in the FPC 5. Moreover, the OPU 1 can be further miniaturized. As shown in FIGS. 3 and 4, it may be preferable to provide a slit S2 in the folding portion 42B so as to facilitate folding at the folding portion 42B.

The component-mounting segment 30 which constitutes the signal-crowding region 10x of the main circuit portion 10 (FIGS. 2-4) further includes the third component-mounting segment 33 on which the LCR 103 (FIG. 9) is arranged. Corresponding to the third component-mounting segment 33, the ground 50g of the sub-circuit portion 50 includes the third planar segment 53. As shown in FIGS. 7, 8, 11, and 12, the second component-mounting segment 32 is folded with respect to the third component-mounting segment 33 while the LCR 101 (FIG. 12) mounted on the first component-mounting segment 31 is placed in an overlapping arrangement with the third planar segment 53.

The second component-mounting segment 33 is folded with respect to the third component-mounting segment 32 (FIGS. 8 and 12) at the folding portions 43A and 43B (FIGS. 7 and 11). More specifically, the folding portion 43A is located at the boundary between the second component-mounting segment 32 and the third component-mounting segment 33 of the main circuit member 10 (FIGS. 7 and 11). At this folding portion 43A, the second component-mounting segment 32 is folded with respect to the third component-mounting segment 33 (FIG. 12). Simultaneously, at the folding portion 43B located at the boundary between the second planar segment 52 and the third planar segment 53 of the sub-circuit member 50 (FIGS. 4,7, and 11), the first component-mounting segment 31 is folded with respect to the third planar segment 53 such that the LCR 101 mounted on the first component-mounting segment 31 is laminated with the third planar segment 53 (FIG. 12). The component-mounting segment 32 (FIG. 11) is swung to be positioned under the third component-mounting segment 33 (FIG. 12). At the same time, the first component-mounting segment 31 is also positioned under the third component-mounting segment 33 (FIG. 12).

According to this arrangement, the S/N ratio of analog signals transmitted around the first 31 and the third 33 component-mounting segments can be improved. A shielding effect is exhibited by the ground 50g of the sub-circuit member 50 interposed between the first component-mounting segment 31 and the third component-mounting segment 33. The third planar segment 53 which constitutes a part of the ground 50g of the sub-circuit member 50 serves to minimize radiation with respect to the electric/electronic components 101 on the first component-mounting segment 31 and the electric/electronic components 103 on the third component-mounting segment 33. According to the above-described arrangement, the single-sided FPC 5 can attain an S/N characteristic that is substantially equivalent to that of the FPC 801 which includes two conductive layers 802, 803 (FIG. 15) formed into one integral unit. As a result, erroneous operations of the pickup device 1 (FIG. 1) generated due to noise can be prevented. Moreover, the pickup device 1 can be further miniaturized.

More specifically, the S/N ratio of low-power analog signals transmitted around the LCRs 101, 103 can be improved. A shielding effect is exhibited by the ground 50g of the sub-circuit member 50 interposed between the LCR 101 and the LDD 102, and by the ground 50g of the sub-circuit member 50 interposed between the LCR 101 and the LCR 103. Further, the first planar segment 51 (FIG. 11), second planar segment 52, and third planar segment 53 (FIG. 12) which constitute the ground 50g of the sub-circuit member 50 serve to minimize radiation of magnetic waves or the like with respect to the LCRs 101, 103.

According to the configuration described above, while the FPC 5 comprises circuit conductors 10c, 10g, 50g, 60g, 70c, and 80c formed in only a single layer, the FPC 5 exhibits an S/N ratio characteristic that is substantially equivalent to that of the FPC 801 which includes two conductive layers 802, 803 (FIG. 15) formed into one integral unit. As a result, erroneous operations of the OPU 1 (FIG. 1) generated due to noise can be prevented. Moreover, the OPU 1 can be further miniaturized.

As shown in FIGS. 3 and 4, a slit S3 is provided in the folding portion 43B so as to facilitate folding at the folding portion 43B. In order to facilitate folding at the folding portion 44B, a notch U4 is formed at the folding portion 44B. Further, in order to facilitate folding at the folding portion 46B, a slit S6 and a notch U4 are provided at the folding portion 46B.

As shown in FIG. 2, the ground 10g provided on the main circuit member 10 preferably has a width which is larger than that of the signal transmission lines 10c through which signals such as analog signals are transmitted. Further, as shown in FIGS. 2 and 5, the first sub-circuit member 50 preferably comprises a wide ground 50g which electrically connects with the ground 10g of the main circuit member 10. Similarly as the first sub-circuit member 50, the second sub-circuit member 60 preferably comprises a wide ground 60g which electrically connects with the ground 10g of the main circuit member 10.

With this arrangement, when a large electric current is made to flow in the LD (not shown) for CD or the LD (not shown) for DVD of the OPU 1 (FIG. 1), for example, it is possible to prevent the current from influencing the analog electric/electronic components such as the LCRs 101, 103 (FIGS. 9-12), thereby improving the S/N ratio of electric signals in the OPU 1 (FIG. 1). Further, by preventing a large electric current flowing in the LD for CD or the LD for DVD of the OPU 1 from influencing the analog electric/electronic components such as the LCRs 101, 103 (FIGS. 9-12), malfunctions of the analog electric/electronic components such as the LCRs 101, 103 can be avoided.

In the optical disc device, when the OPU 1 (FIG. 1) is used to record data on a CD-R (not shown), for example, a pulse current of several hundred mA (miliamperes) is made to flow in the LD (not shown) for CD. In synchronization with the flow of the pulse current, a strong magnetic wave is instantaneously generated. As such, if the LD and the PDIC (not shown) are installed in the OPU 1 close to one another, the LD would greatly influence the PDIC. This would result in generation of malfunctions which cause erroneous operations of the OPU 1.

According to the present embodiment, such malfunctions are prevented by folding in half (as shown in FIGS. 9-12) the component-mounting portion 30 having the electric/electronic components 101, 102, 103 provided thereon so as to interpose the sub-circuit member 50 for grounding between the electric/electronic components 101, 102, 103, as shown in FIG. 12, and also by forming the respective grounds 10g, 50g, 60g of the FPC 5 (FIG. 2) sufficiently wider than the signal transmission lines 10c.

As shown in FIGS. 2-4, the sub-circuit portion 50, 60, 70, 80 comprises at least the first sub-circuit portion 50 and the second sub-circuit portion 60 (FIG. 5) which is coupled to the first sub-circuit portion 50 so as to enable electrical connection. The first sub-circuit portion 50 and the second sub-circuit portion 60 are formed as separate entities, and are embodied as the first sub-circuit member 50 and the second sub-circuit member 60, respectively.

Further, as shown in FIGS. 2-4, the main circuit portion 10 is configured as the main circuit member 10 which is integrally formed with the first sub-circuit member 50. The main circuit member 10 and the first sub-circuit member 50 are formed as a single unit, and the ground 50g of the first sub-circuit member 50 is connected with the ground 10g of the main circuit member 10. As shown in FIG. 5, the ground 50g of the first sub-circuit member 50 and the ground 60g of the second sub-circuit member 60 are coupled to one another by soldering so as to achieve electrical connection The above-described arrangement enables provision of a pickup device 1 configured with a flexible circuit member 5 in which cost reduction is achieved. The flexible circuit member 5 may be die-cut from a standard-sized sheet (not shown) in the form of a plurality of separate members, namely, the main circuit member 10 including the first sub-circuit member 50, and the second sub-circuit member 60, such that efficient fabrication can be achieved. When the flexible circuit member 5 is die-cut from a standard-sized sheet in the form of multiple members separated into the main circuit member 10 including first sub-circuit member 50 and the second sub-circuit member 60, scraps of the standard-sized sheet which remain after the die-cutting process can be minimized, thereby achieving a reduction in wasted standard-sized sheets and an increase in yield per standard-sized sheet. The main circuit member 10 including the first sub-circuit member 50 can be easily and quickly coupled to the second sub-circuit member 60 for electrical connection by soldering. By fabricating as described above, it is possible to provide a pickup device 1 configured with a flexible circuit member 5 in which cost reduction is achieved.

When performing the die-cutting process, the fourth sub-circuit member 80 is die-cut from the same standard-sized sheets as the main circuit member 10 including the first sub-circuit member 50. Further, the second sub-circuit member 60 and the third sub-circuit member 70 are die-cut from the same standard-sized sheets.

When the sub-circuit members 50, 60 are folded with respect to the main circuit member 10 so as to place the main circuit member 10 and the sub-circuit members 50, 60 in an overlapping arrangement as shown in FIGS. 5, 6, 9, and 10, the double-coated adhesive tapes 31T (FIGS. 4, 9, and 10), 36T (FIG. 4) are used to adhere the main circuit member 10 and the sub-circuit members 50, 60 to one another.

During the folding process of the FPC 5, use of the double-coated adhesive tapes 31T, 36T facilitates folding of the sub-circuit members 50, 60 with respect to the main circuit member 10 of the FPC 5. The FPC 5 generally has high flexibility. When the substantially planar FPC 5 is being folded, restorative elasticity of the FPC 5 itself works to restore the FPC 5 to its original shape. For this reason, after completion of the bending or folding process, it is often difficult to maintain the FPC 5 accurately in the bent state.

According to the present embodiment, when the sub-circuit members 50, 60 of the FPC 5 are folded with respect to the main circuit member 10 of the FPC 5 so as to place the main circuit member 10 and the sub-circuit members 50, 60 in an overlapping arrangement, the double-coated adhesive tapes 31T, 36T are employed to adhere the sub-circuit members 50, 60 of the FPC 5 to the main circuit member 10 of the FPC 5. With this arrangement, the sub-circuit members 50, 60 of the FPC 5 can be maintained accurately in the folded state with respect to the main circuit member 10 of the FPC 5. Production efficiency of the OPU 1 fabrication process can thereby be enhanced, and, as a result, the OPU 1 can be supplied at a low cost.

After the sub-circuit members 50, 60 are folded with respect to the main circuit member 10 so as to place the main circuit member 10 and the sub-circuit members 50, 60 in an overlapping arrangement as shown in FIGS. 5, 6, 9, and 10, the sub-circuit members 50, 60 are soldered to the main circuit member 10 so as to electrically connect the sub-circuit members 50, 60 and the main circuit member 10.

More specifically, a terminal 51j formed protruding from the first planar segment 51 of the first sub-circuit member 50 (FIGS. 3 and 5) is soldered to a terminal 31j (FIG. 3) provided on the first component-mounting segment 31 of the main circuit member 10. As a result, as shown in FIG. 6, the first component-mounting segment 31 of the main circuit member 10 is electrically connected to the ground 50g of the first sub-circuit member 50 (FIG. 5).

Further, a terminal 60j formed protruding from the second sub-circuit member 60 (FIGS. 3 and 5) is soldered to a terminal 36j (FIG. 3) provided on the sixth component-mounting segment 36 of the main circuit member 10. As a result, as shown in FIG. 6, the sixth component-mounting segment 36 of the main circuit member 10 is electrically connected to the ground 60g of the second sub-circuit member 60 (FIG. 5).

According to the above arrangement, it is possible to avoid hindering the normal operations of various electric/electronic components mounted on the main circuit member 10 of the FPC 5 (FIGS. 5 and 6). By adopting the configuration in which the sub-circuit members 50, 60 of the FPC 5 are folded with respect to the main circuit member 10 of the FPC 5 so as to place the main circuit member 10 and the sub-circuit members 50, 60 in an overlapping arrangement, and the first sub-circuit member 50 is soldered to the first component-mounting segment 31 of the main circuit member 10 so as to electrically connect between the first component-mounting segment 31 of the main circuit member 10 and the first sub-circuit member 50, it is possible to prevent noise from influencing the LCR 101 (FIG. 9) which is arranged on the first component-mounting segment 31 of the main circuit member 10.

Further, by adopting the configuration in which the sub-circuit members 50, 60 of the FPC 5 (FIGS. 5 and 6) are folded with respect to the main circuit member 10 of the FPC 5 so as to place the main circuit member 10 and the sub-circuit members 50, 60 in an overlapping arrangement, and the second sub-circuit member 60 is soldered to the sixth component-mounting segment 36 of the main circuit member 10 so as to electrically connect between the sixth component-mounting segment 36 of the main circuit member 10 and the second sub-circuit member 60, it is possible to prevent noise from influencing the EEPROM (not shown) mounted on the sixth component-mounting segment 36 of the main circuit member 10. Accordingly, abnormal operations of the OPU 1 (FIG. 1) due to malfunctions of various electric/electronic components of the main circuit member 10 caused by noise can be avoided.

The FPC 5 (FIGS. 2-4) also comprises a further sub-circuit member 80 which is mounted on the main circuit member 10. The further sub-circuit member 80 is a bypass sub-circuit member for electrically connecting between one terminal 10j of the main circuit member 10 and another terminal 10k of the main circuit member 10 while bypassing predetermined circuit conductors 10c (FIG. 10) formed on the main circuit member 10. Although the circuit conductors 10c are illustrated in simplified form in FIG. 2, many circuit conductors 10c are actually formed extending widely over the base 10b of the main circuit member 10.

When mounting the further sub-circuit member 80 on the main circuit member 10, one terminal 80j (FIG. 3) of the further sub-circuit member 80 is connected to one terminal 10j of the main circuit member 10, while another terminal 80k of the further sub-circuit member 80 is connected to another terminal 10k of the main circuit member 10.

By configuring the FPC 5 using a further sub-circuit member 80 which is mounted on the main circuit member 10, the degree of freedom in designing the FPC 5 can be increased. Further, normal operations of the various electric/electronic components mounted on the FPC 5 can be promoted. Numerous circuit conductors 10c are formed so as to extend widely, in a complex manner, over the main circuit member 10 constituting the FPC 5.

By employing the further sub-circuit member 80 of the FPC 5 as the bypass circuit for electrically connecting between one terminal 10j of the main circuit member 10 and another terminal 10k of the main circuit member 10 while bypassing predetermined circuit conductors 10c formed on the main circuit member 10, design of the complex circuit conductors 10c, 10g can be facilitated. As a result, the design cost of the FPC 5 can be reduced, in turn reducing the fabrication cost of the OPU 1. Furthermore, the influence of noise on various electric/electronic components mounted on the main circuit member 10 can be minimized.

The further sub-circuit member 80 is mounted on the main circuit member 10 (FIGS. 2-4) by soldering so as to electrically connect between the main circuit member 10 and the further sub-circuit member 80. A solder portion 10S of the main circuit member 10 (FIG. 3) is placed in contact with a solder portion 80S of the further sub-circuit member 80, and soldering is carried out in the contacted areas (areas colored in black in FIG. 3). In this manner, the main circuit member 10 and the further sub-circuit member 80 are joined to allow electrical connection.

To explain specific details, when mounting the further sub-circuit member 80 on the main circuit member 10, one terminal 80j of the further sub-circuit member 80 is soldered to one terminal 10j of the main circuit member 10, while another terminal 80k of the further sub-circuit member 80 is soldered to another terminal 10k of the main circuit member 10.

By soldering between the sub-circuit member 80 and the main circuit member 10 which constitute the FPC 5 so as to achieve electrical connection, the FPC 5 comprising the main circuit member 10 and the further sub-circuit member 80 can be easily fabricated. Manufacturing cost of the FPC 5 can therefore be reduced. As a result, cost of the OPU 1 (FIG. 1) can be minimized even when the OPU 1 includes an FPC 5 which is configured by mounting the further bypass sub-circuit member 80 on the main circuit.

A terminal 23 formed by extending the ground 10g of the main circuit member 10 (FIGS. 2 and 5-8) is coupled for electrical connection with a metal heat radiator plate (not shown) mounted on a metal housing 1H (FIG. 1). By means of the terminal 23, the ground 10g of the main circuit member 10 is easily and reliably soldered to the metal heat radiator plate, and heat generated from the LD (not shown) or the like in the OPU 1 is efficiently dissipated via the metal heat radiator plate. The metal heat radiator plate is preferably composed of a copper plate. The metal housing 1H having the copper heat radiator plate attached thereto is movably supported by a metal screw shaft 3 and a metal guide shaft 4.

The OPU 1 is grounded via the ground 10g of the main circuit member 10 constituting the FPC 5, the metal heat radiator plate connected to the ground 10g of the main circuit member 10, the metal housing 1H having the metal heat radiator plate attached thereto, and the metal screw shaft 3 and/or the metal guide shaft 4.

Second Embodiment

Figure 13:
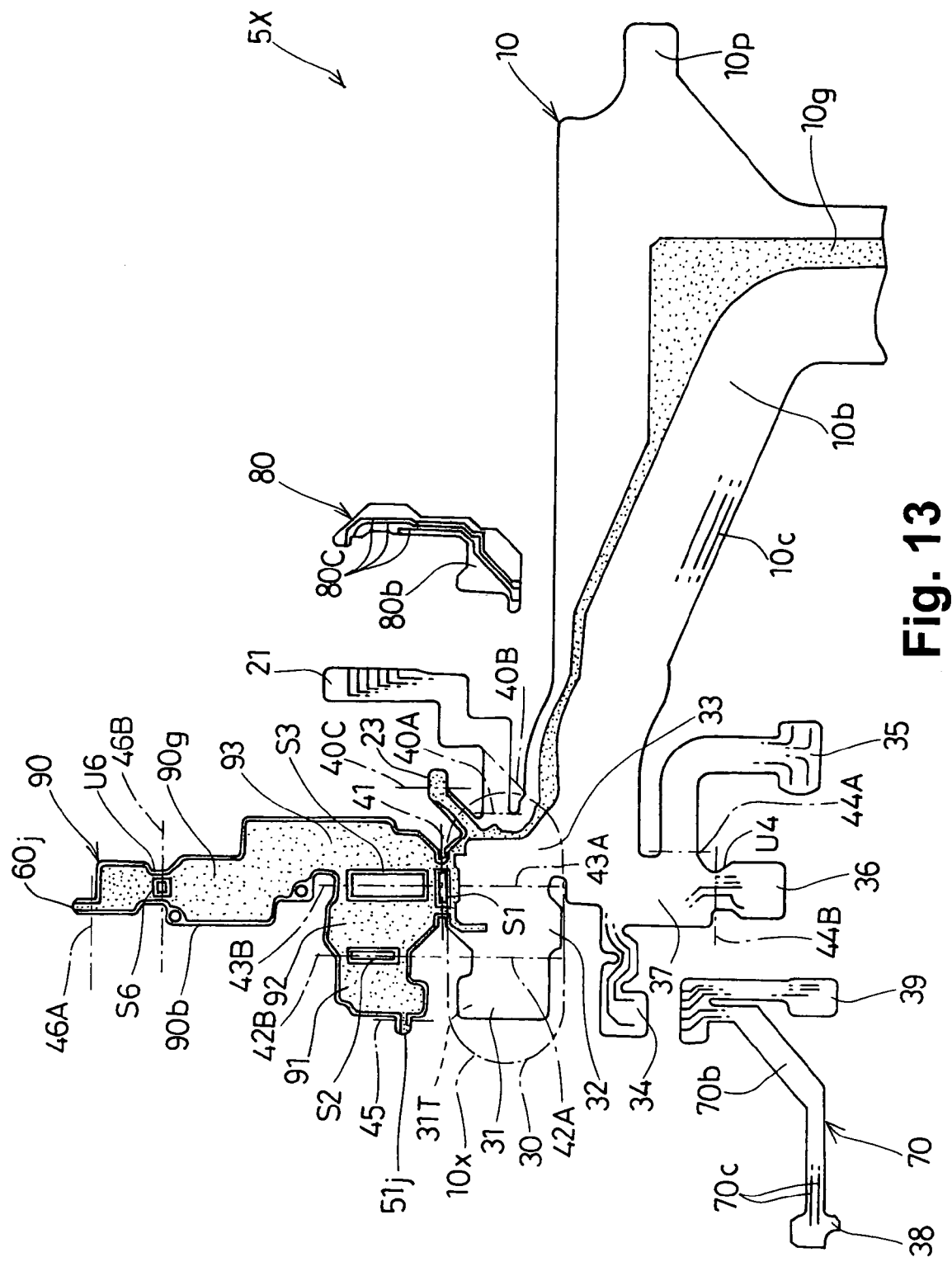
FIG. 13 is a plan view showing a flexible circuit member used in a second embodiment of the pickup device according to the present invention.
Figure 14:
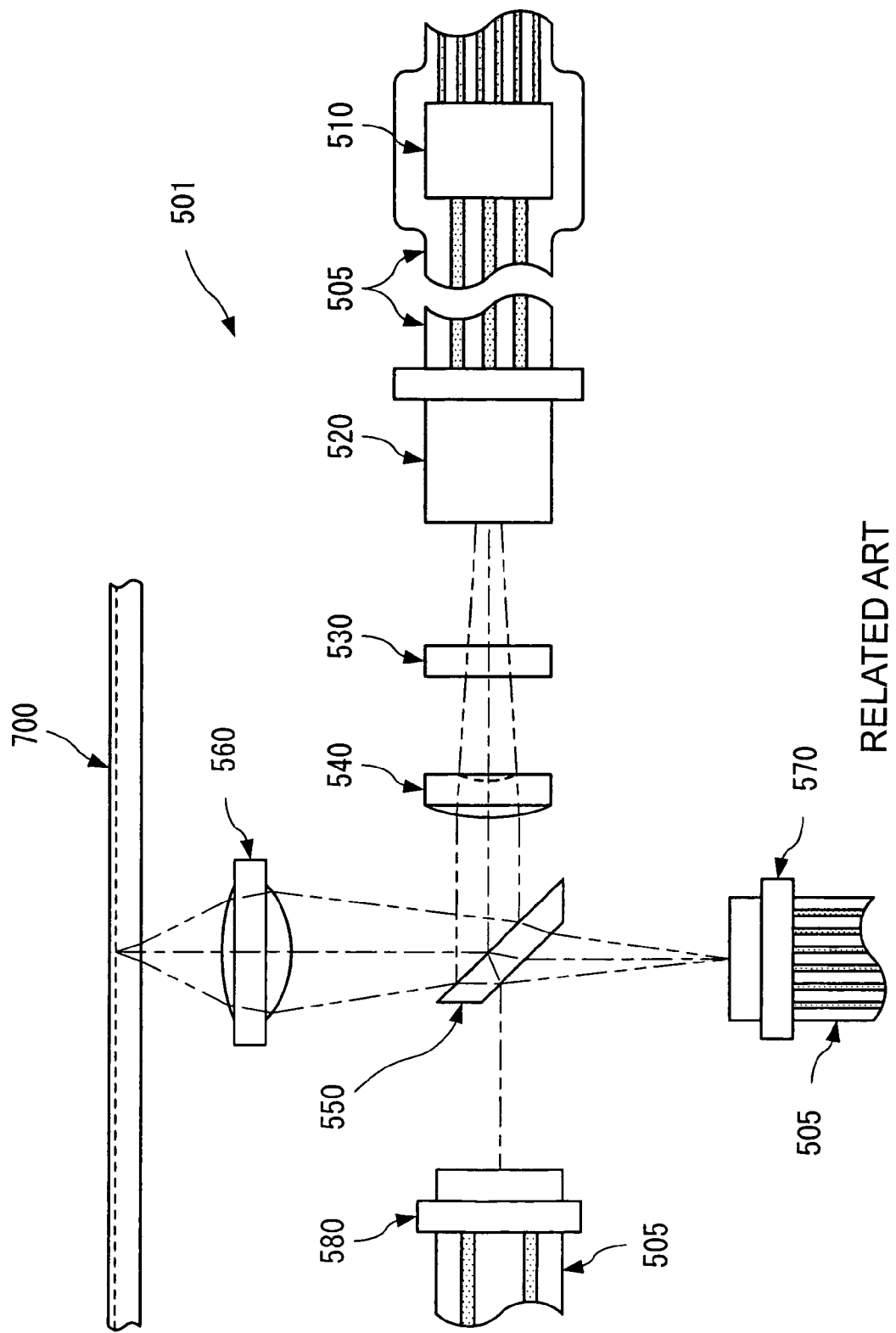
FIG. 14 is an explanatory diagram illustrating a pickup device according to background art.

FIG. 13 is a plan view showing a flexible circuit member used in a second embodiment of the pickup device according to the present invention.

FIG. 13 schematically shows an essential portion of the flexible circuit member 5X. Although not shown, the flexible circuit member 5X actually comprises solder portions that are substantially identical to the solder portions colored in black in FIG. 3. The flexible circuit member 5X (FIG. 13) further comprises the reinforcement plates 31P, 32P, 33P, 34P, 35P, 36P, 37P, 38P, and 39P as shown in FIG. 4, and the double-coated adhesive tape 31T (FIGS. 4 and 9). Elements in FIG. 13 which are identical to those explained using FIGS. 1-12 are labeled with like reference numerals, and description of those elements will not be repeated below.

In the flexible circuit member 5 shown in FIGS. 2-4, the first sub-circuit member 50 included in the main circuit member 10 and the second sub-circuit member 60 electrically connected to the first sub-circuit member 50 are constructed as separate entities. In contrast, in the flexible circuit member 5X shown in FIG. 13, the portion corresponding to the first sub-circuit member 50 (FIGS. 2-5) and the portion corresponding to the second sub-circuit member 60 are integrally constructed as a single sub-circuit member 90 (FIG. 13). While the flexible circuit member 5X of FIG. 13 differs from the flexible circuit member 5 of FIGS. 2-12 in this point, all other points are identical (as can be seen in FIGS. 5 and 13).

The sub-circuit member 90 which constitutes the flexible printed circuit member (FPC) 5 is formed by printing a circuit conductor 90g composed of a metal foil such as copper foil on a base 90b which is an insulating sheet made of polyimide resin, and further providing a protective layer on top. The base 90b is preferably composed of a heat-resistant synthetic polymer such as polyimide resin. The circuit conductor 90g composed of a metal foil such as copper foil is formed in a single layer alone with respect to the base 90b. The circuit conductor 90g is formed as the ground 90g to be arranged on the grounding side. The sub-circuit portion 90 is formed integrally with the main circuit portion 10 of the FPC 5X, and comprises a first planar segment 91, second planar segment 92 extending continuously from the first planar segment 91, and third planar segment 93 extending continuously from the second planar segment 92.

According to this configuration, while only a single layer of circuit conductor is formed in the FPC 5X, the FPC 5X (FIG. 13) can be employed in a state in which GND is reinforced to a level substantially equivalent to that of the costly FPC 801 which includes two conductive layers 802, 803 (FIG. 15) formed into one integral unit. The S/N ratio of electric signals transmitted in the FPC 5X can thereby be improved. Further, isolation between digital signals and analog signals in the FPC 5X can be accomplished. By achieving isolation between digital signals and analog signals transmitted in the FPC 5X, the S/N ratio of electric signals transmitted in the FPC 5X can be improved.

Moreover, manufacturing costs can be minimized because the FPC 5X (FIG. 13) including only a single layer of circuit conductor is employed, eliminating the need to use the costly FPC 801 which includes two conductive layers 802, 803 (FIG. 15) formed into one integral unit. Because the number of parts of the sub-circuit member 90 is reduced, the number of soldering processes can be minimized, leading to reduction in manufacturing cost of the OPU 1X (FIG. 1).

As described above, in an optical pickup device according to an embodiment of the present invention, the GND pattern is reinforced using a single-sided FPC. An optical pickup device according to an embodiment of the present invention implements a method for reinforcing the ground pattern using a single-sided flexible printed circuit member (FPC). As a result, there is provided an optical pickup device in which the S/N ratio of electric signals is improved.

The above-described OPU 1, 1X (FIG. 1) may be installed in a read-only optical disc device adapted for reading out data from optical discs such as a CD-ROM and DVD-ROM. Alternatively, the above-described OPU 1, 1X (FIG. 1) may be installed in an optical disc device adapted for use with read-only optical discs such as a CD-ROM and DVD-ROM, write-once optical discs including CD-R, DVD-R, and DVD+R, and writable/erasable or rewritable optical discs such as a CD-RW, DVD-RW, DVD+RW, DVD-RAM, HD-DVD, and Blu-ray Disc.

The disc device including the above-described OPU 1, 1X may be provided in, for example, personal computers such as a notebook personal computer and desktop personal computer, audio instruments such as a CD player, and audiovisual instruments such as a DVD player. "Personal computer" is abbreviated as "PC". The disc device including the OPU 1, 1X may be adapted for use with multiple types of media such as CD-type optical discs and DVD-type optical discs.

The optical disc device (not shown) is configured as a player in which either one or both of CD and DVD optical discs can be used. The CD player, the DVD player, and the player adapted for use with both CDs and DVDs may be incorporated in a notebook PC, desktop PC, or the like. A desktop computer is a computer which is usable on a desk, and is of a type that is not easily portable.

In contrast to a desktop PC, there are demands for reductions in weight and thickness of notebook PCs. Accordingly, a notebook PC is often equipped with an optical disc device (not shown) referred to as a slim-type drive. A notebook PC has a structure which differs from that of a desktop PC. A notebook PC is formed as a single module which incorporates therein a display (not shown) and a main personal computer unit (not shown). A notebook PC is configured to have a thin size by allowing the display to be folded with respect to the main personal computer unit. A notebook PC is a general-purpose PC having a plan view size of approximately A4 or smaller when in a folded state. For this reason, a notebook PC may also be referred to as a book PC. As such, a notebook PC is compact and easily portable.

The housing 1H of the optical pickup device 1 can be used to configure a thin-type disc device for a notebook PC. For that purpose, the housing 1H may be formed in a thin shape having a substantially flat shape.

The OPU 1, 1X can function normally even when mounted in a notebook PC. While enhancements in performance are achieved in recent notebook computers, reductions in size, weight, and thickness are also promoted. Along with reductions in size, weight, and thickness of notebook computers, the OPU 1, 1X is also reduced in size, weight, and thickness. The FPC 5, 5X provided in the housing 1H is arranged while being folded in a complex manner. Although an FPC 5, 5X may be mounted within the OPU 1, 1X while being folded in a complex manner, use of the single-sided FPC 5, 5X as described above makes it possible to configure an OPU 1, 1X for a notebook PC with minimized influence of noise.

The flexible circuit member which may be provided in a disc device, a pickup device within a disc device, a pickup device, and the like is not limited to those shown in the drawings. The present invention is intended to include various modifications that can be made thereto without deviating from the scope of the present invention.

What is claimed is:

1. A pickup device, comprising:
a flexible circuit member including a main circuit portion on which an electric or electronic component is mounted, and a sub-circuit portion connected to the main circuit portion; and
a housing on which the flexible circuit member is mounted, wherein
the main circuit portion has a single-sided structure and includes a ground portion;
the sub-circuit portion has a single-sided structure and includes a ground portion;
the main circuit portion includes a component-mounting segment on which the electric or electronic component is mounted;
the component-mounting segment comprises a first component-mounting segment on which a first electric or electronic component is mounted;
the ground portion of the sub-circuit portion includes a first planar segment provided corresponding to the first component-mounting segment;
the component-mounting segment further comprises a second component-mounting segment on which a second electric or electronic component is mounted;
the ground portion of the sub-circuit portion further includes a second planar segment provided corresponding to the second component-mounting segment;
the sub-circuit portion is folded with respect to the main circuit portion, and the flexible circuit member is mounted on the housing while the main circuit portion and the sub-circuit portion are held in an overlapping arrangement; and
the first component-mounting segment is folded with respect to the second component-mounting segment while the first planar segment is placed in an overlapping arrangement with the second planar segment.

2. A pickup device as defined in claim 1, wherein
the component-mounting segment further comprises a third component-mounting segment on which a third electric or electronic component is mounted;
the ground portion of the sub-circuit portion further includes a third planar segment provided corresponding to the third component-mounting segment; and
the second component-mounting segment is folded with respect to the third component-mounting segment while the first electric or electronic component mounted on the first component-mounting segment is placed in an overlapping arrangement with the third planar segment.

3. A pickup device as defined in claim 1, wherein
the sub-circuit portion comprises a first sub-circuit portion and a second sub-circuit portion which is electrically connected to the first sub-circuit portion;
the first sub-circuit portion and the second sub-circuit portion are separate entities;
the first sub-circuit portion is fabricated as a first sub-circuit member, while the second sub-circuit portion is fabricated as a second sub-circuit member;
the main circuit member and the first sub-circuit member are formed as a single unit, and a ground portion of the first sub-circuit member extends continuously from the ground portion of the main circuit member; and
the ground portion of the first sub-circuit member and a ground portion of the second sub-circuit member are soldered to one another so as to be electrically connected.

4. A pickup device as defined in claim 1, wherein
the pickup device is mountable on a disc device for a notebook computer.

5. A pickup device comprising:
a flexible circuit member including a main circuit portion on which an electric or electronic component is mounted, and a sub-circuit portion connected to the main circuit portion; and
a housing on which the flexible circuit member is mounted, wherein
the main circuit portion has a single-sided structure and includes a ground portion;
the sub-circuit portion has a single-sided structure and includes a ground portion;
the sub-circuit portion is folded with respect to the main circuit portion, and the flexible circuit member is mounted on the housing while the main circuit portion and the sub-circuit portion are held in an overlapping arrangement; and when the sub-circuit portion is folded with respect to the main circuit portion so as to place the main circuit portion and the sub-circuit portion in an overlapping arrangement, the main circuit portion and the sub-circuit portion are adhered to one another by means of an adhesive tape which is capable of attaching the main circuit portion to the sub-circuit portion.

6. A pickup device comprising:

a flexible circuit member including a main circuit portion on which an electric or electronic component is mounted, and a sub-circuit portion connected to the main circuit portion; and a housing on which the flexible circuit member is mounted, wherein the main circuit portion has a single-sided structure and includes a ground portion;

the sub-circuit portion has a single-sided structure and includes a ground portion;

a further sub-circuit portion is attached to the main circuit portion;

the further sub-circuit portion serves as a bypass circuit for connecting one terminal of the main circuit portion to another terminal of the main circuit portion while bypassing a circuit conductor of the main circuit portion; and the sub-circuit portion is folded with respect to the main circuit portion, and the flexible circuit member is mounted on the housing while the main circuit portion and the sub-circuit portion are held in an overlapping arrangement.

7. A pickup device as defined in claim 6, wherein when attaching the further sub-circuit portion to the main circuit portion, the main circuit portion and the further sub-circuit portion are soldered to one another so as to be electrically connected.

* * * * *